(12) United States Patent
Doyle et al.

(10) Patent No.: US 6,197,676 B1
(45) Date of Patent: Mar. 6, 2001

(54) METHOD OF FORMING METAL LINES

(75) Inventors: Brian S. Doyle, Cupertino; Peng Cheng, Campbell, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/226,670

(22) Filed: Jan. 6, 1999

(51) Int. Cl.$^7$ ................................................ H01L 21/4763
(52) U.S. Cl. ............................................ 438/622; 438/622
(58) Field of Search .................................... 438/253, 262, 438/263, 265, 637, 638, 639, 671, 672, 622, 666, 564, 669

(56) References Cited

U.S. PATENT DOCUMENTS

| | | | |
|---|---|---|---|
| 4,843,034 | * 6/1989 | Herndon et al. | 437/189 |
| 5,384,953 | * 1/1995 | Economikos et al. | 29/846 |
| 5,422,308 | * 6/1995 | Nicholls et al. | 437/192 |
| 5,472,901 | * 12/1995 | Kapoor et al. | 437/60 |
| 5,846,860 | * 12/1998 | Shih et al. | 438/253 |
| 5,977,638 | * 11/1999 | Rodgers et al. | 257/773 |

* cited by examiner

*Primary Examiner*—David Nelms
*Assistant Examiner*—David Nhu
(74) *Attorney, Agent, or Firm*—Blakely, Sokoloff, Taylor & Zafman LLP

(57) ABSTRACT

The invention provides a method of forming a metal line. A step is formed on a substrate. According to one method of the invention a metal layer is formed on the substrate and on the step. The metal layer is then etched. A portion of the metal layer remains adjacent the step and the substrate is exposed adjacent the portion of the metal layer.

20 Claims, 26 Drawing Sheets

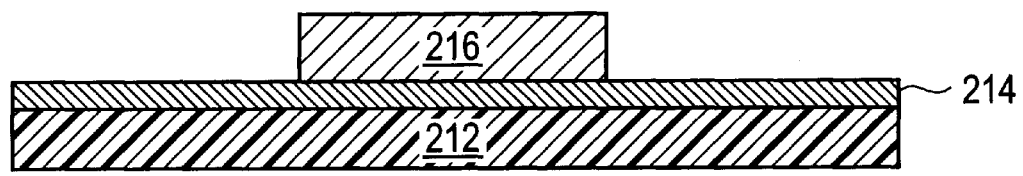
FIG. 2A(i)
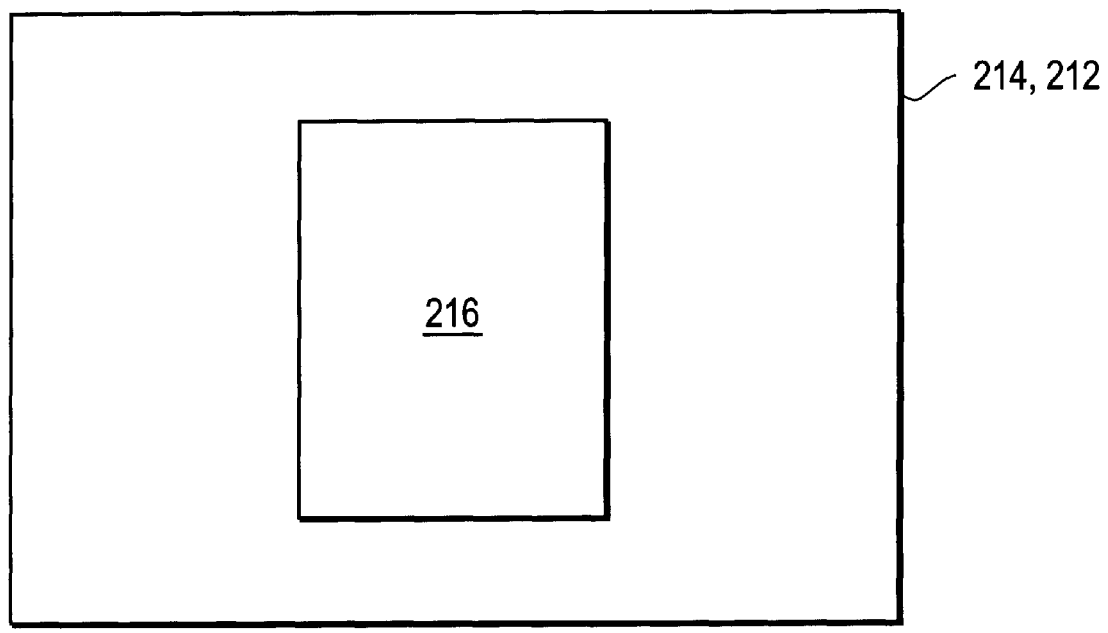
FIG. 2A(ii)

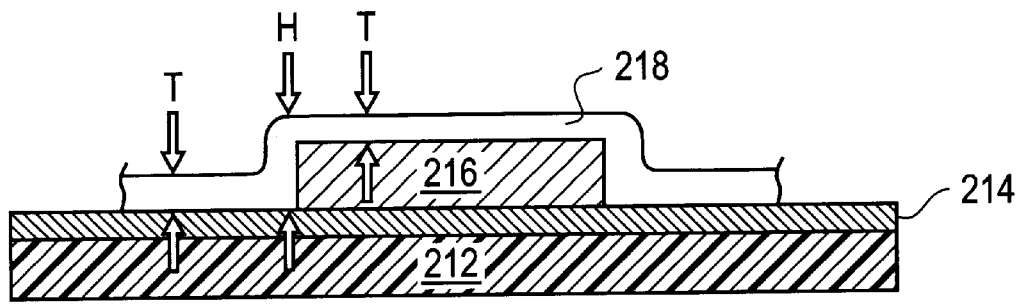
FIG. 2B(i)
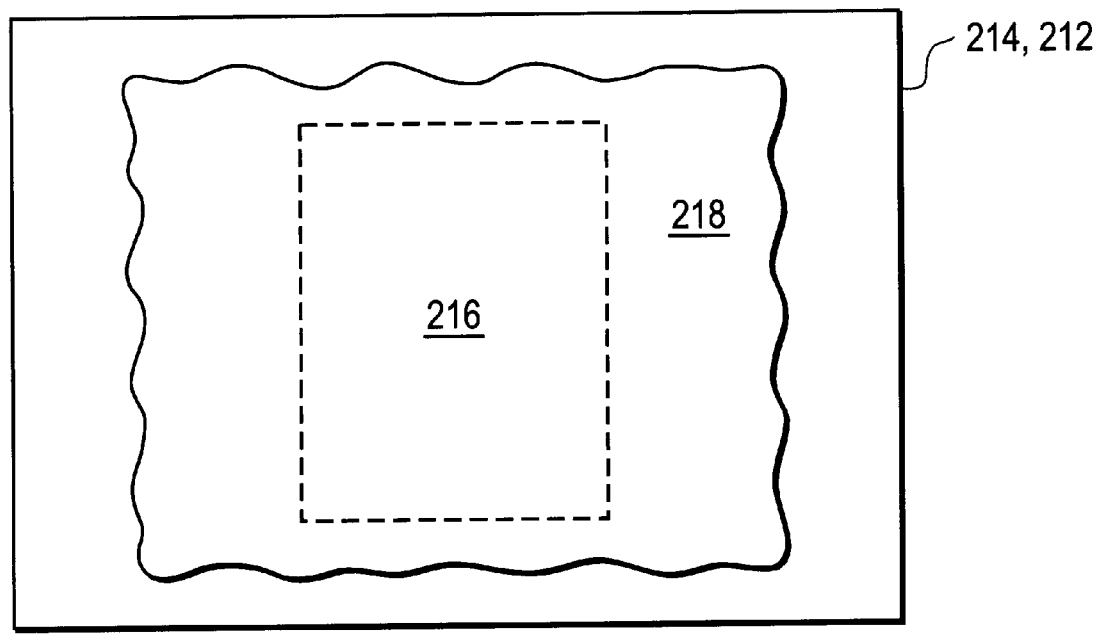
FIG. 2B(ii)

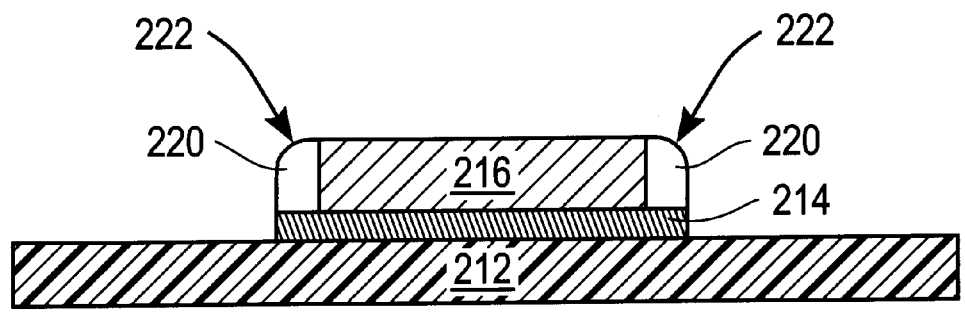
FIG. 2C(i)
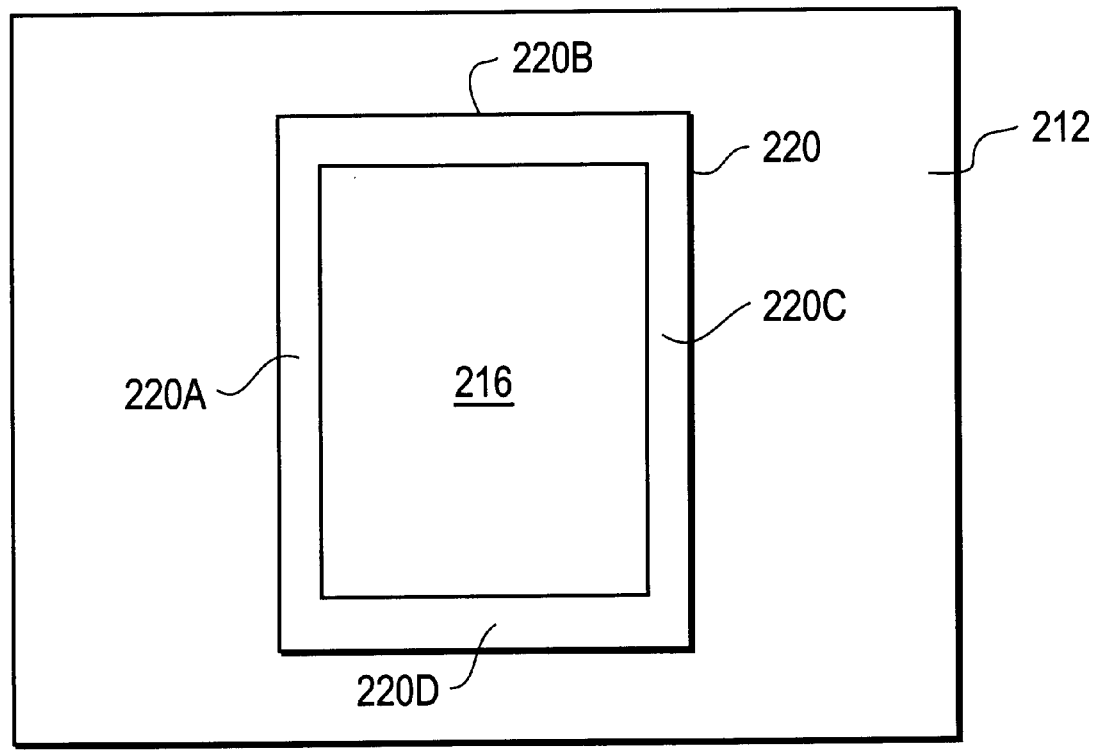
FIG. 2C(ii)

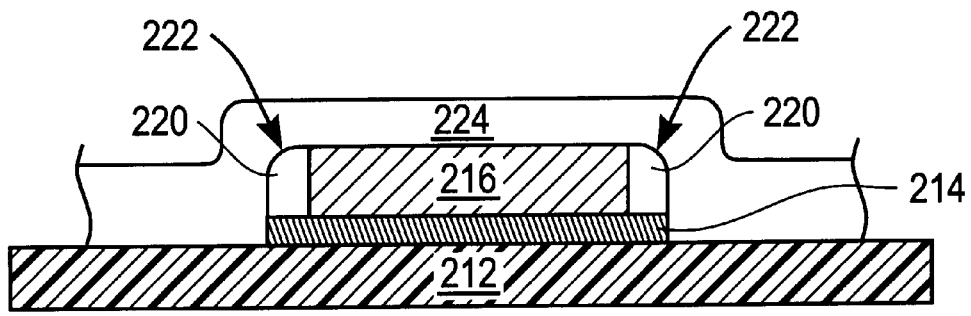
FIG. 2D(i)
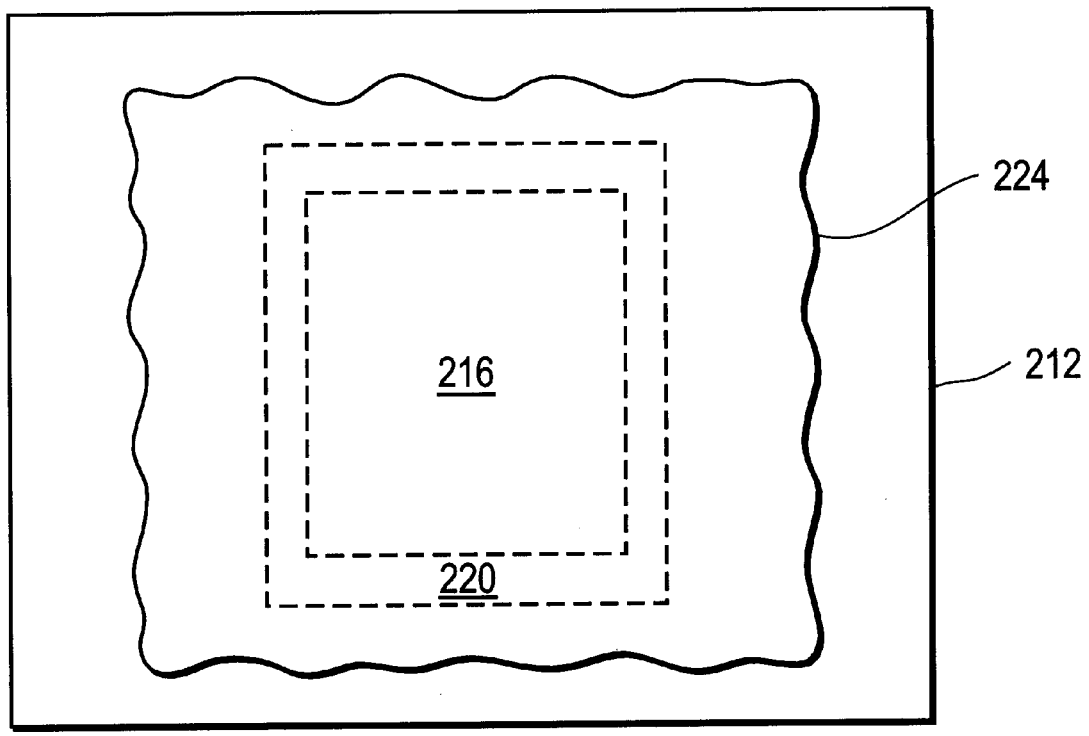
FIG. 2D(ii)

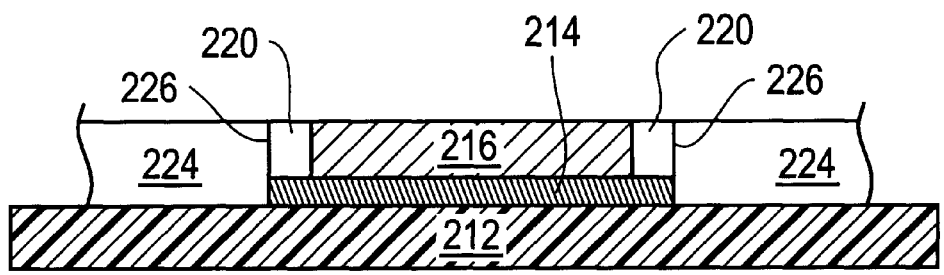
FIG. 2E(i)
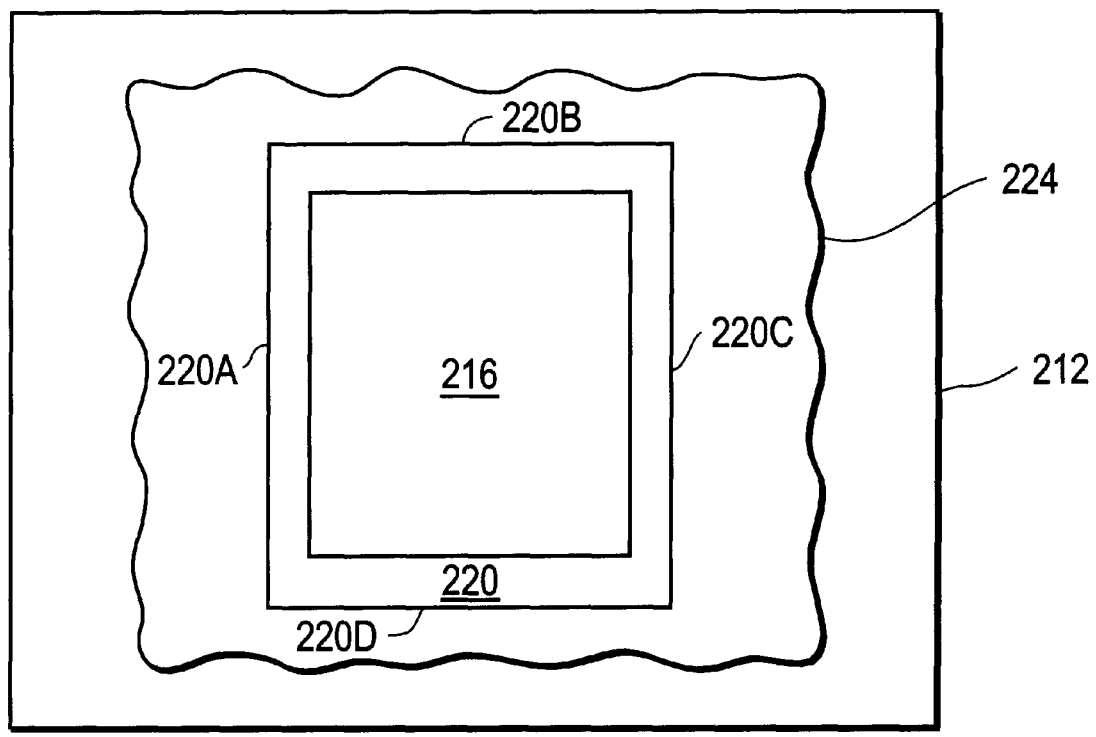
FIG. 2E(ii)

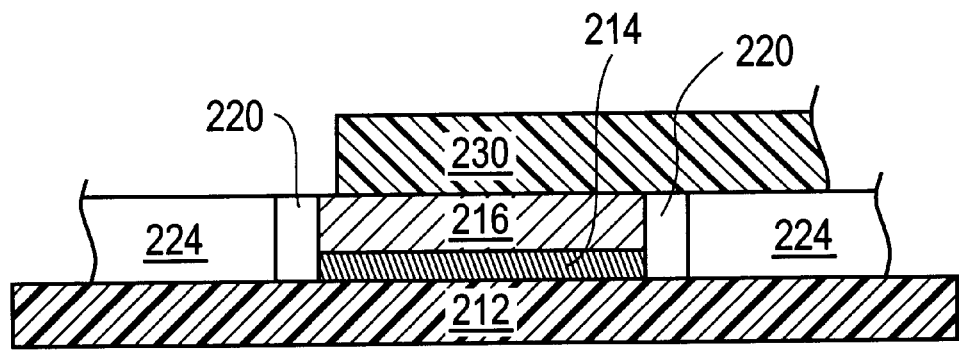
FIG. 2F(i)
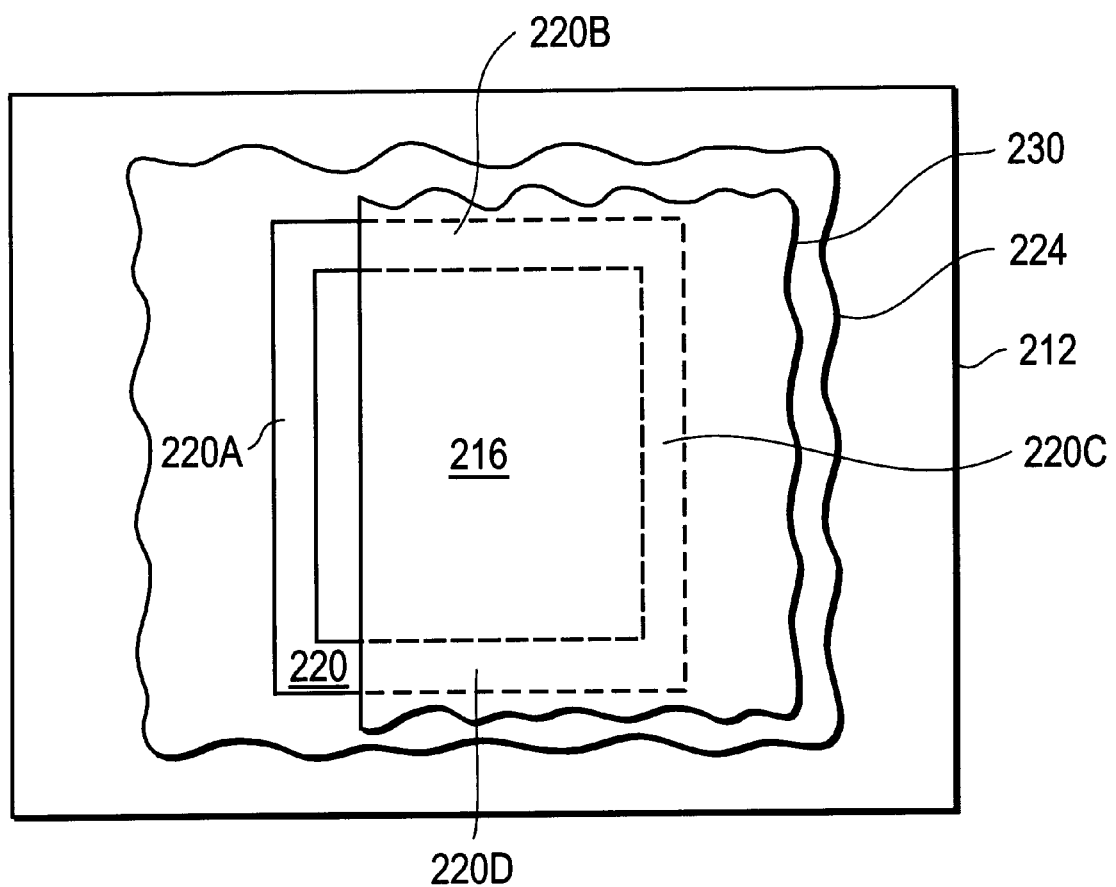
FIG. 2F(ii)

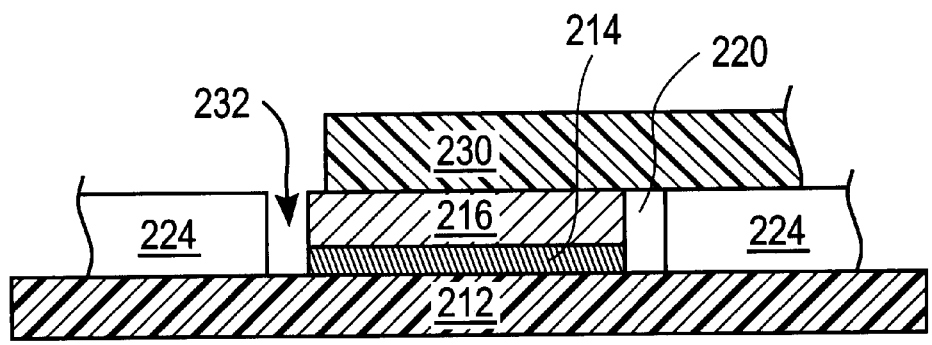
FIG. 2G(i)
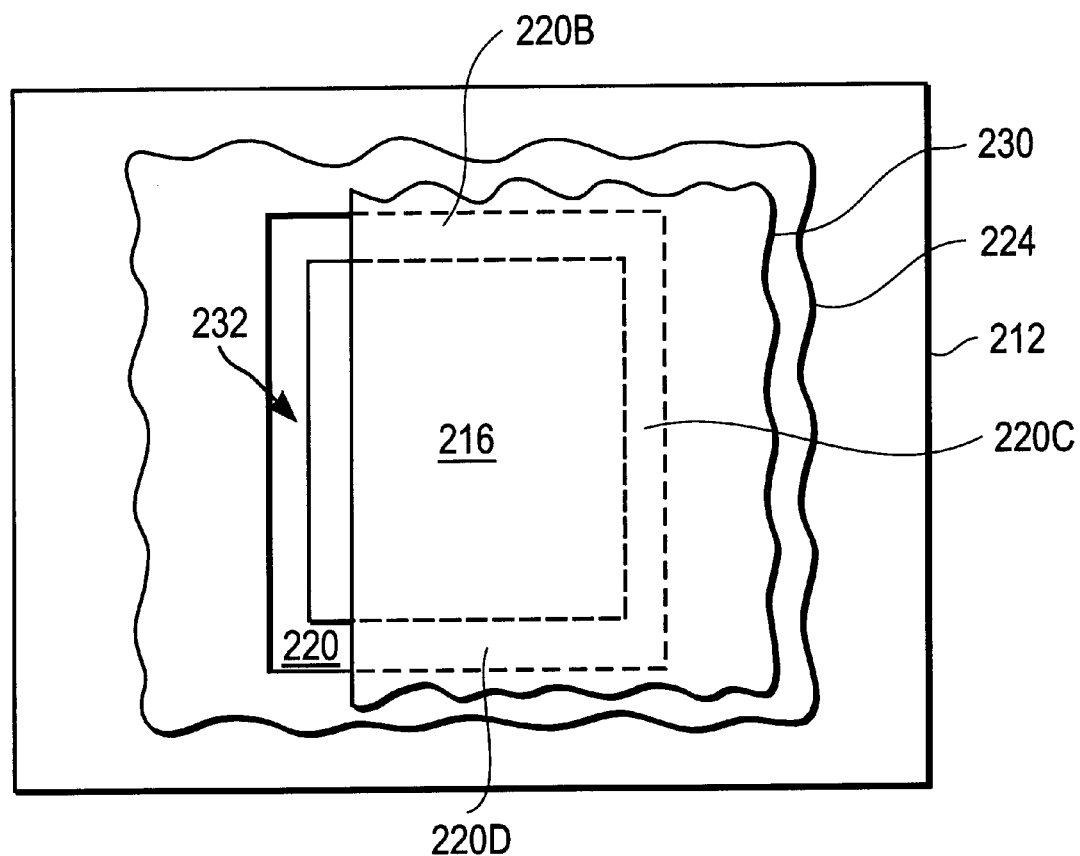
FIG. 2G(ii)

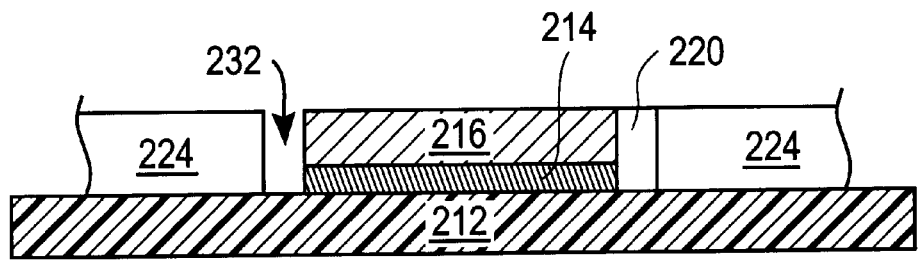
FIG. 2H(i)
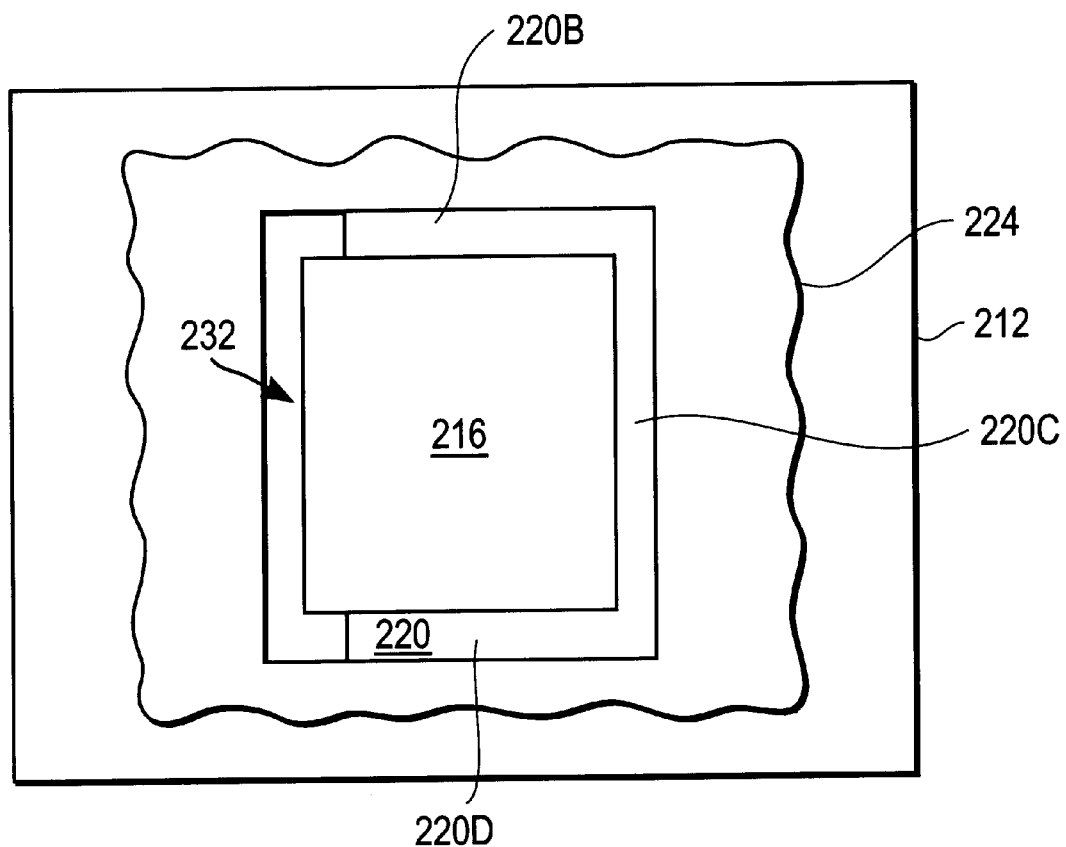
FIG. 2H(ii)

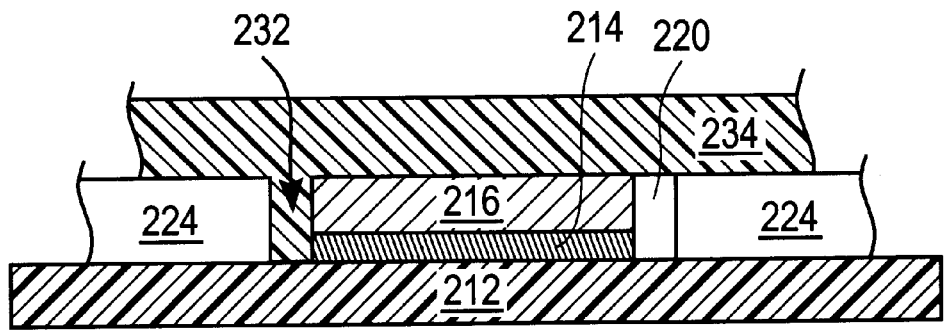
FIG. 2I(i)
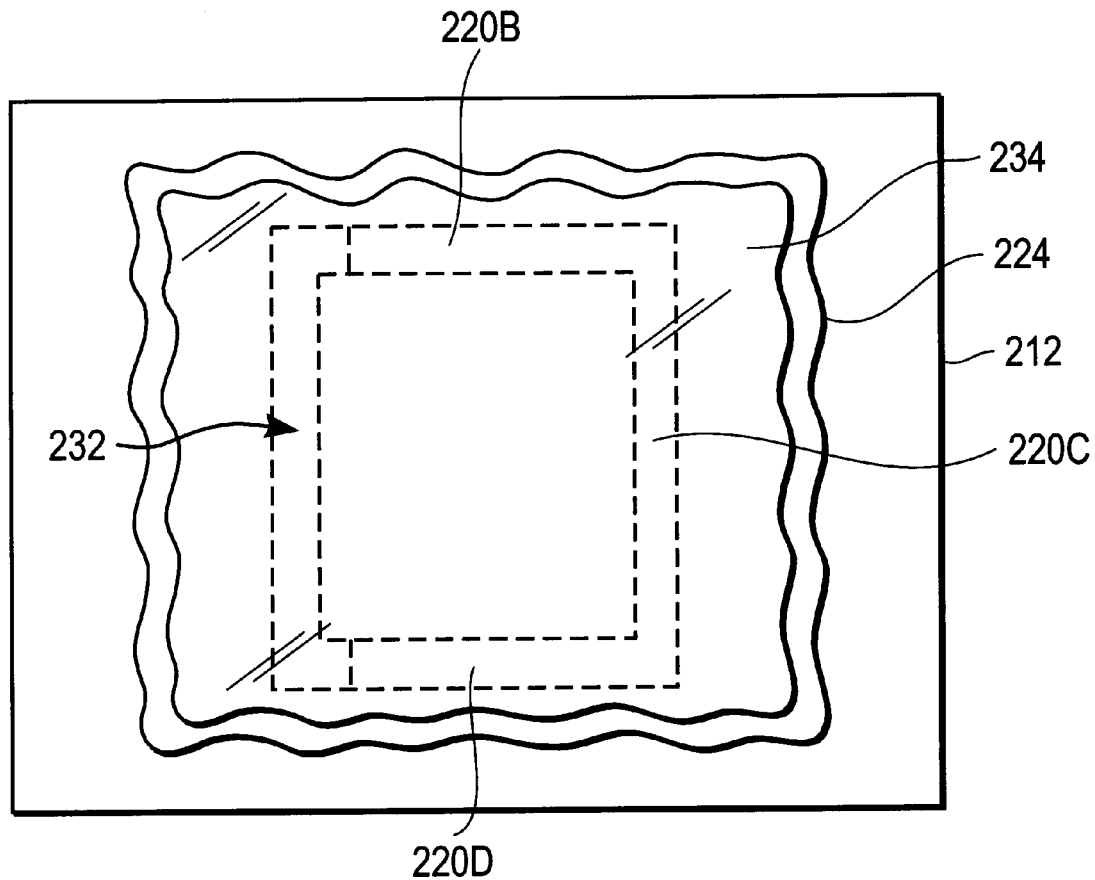
FIG. 2I(ii)

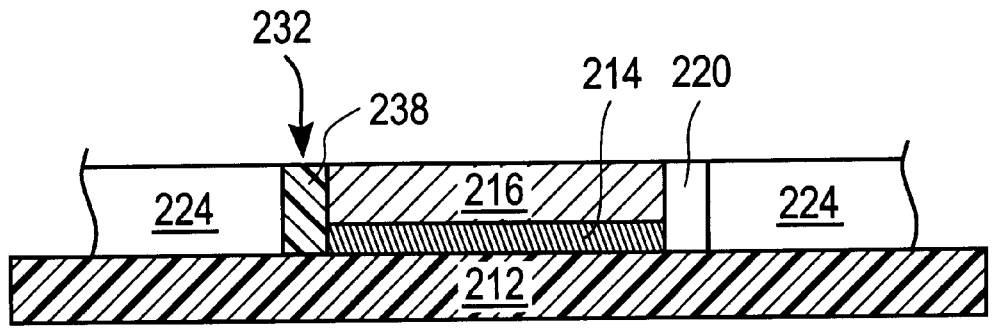
FIG. 2J(i)
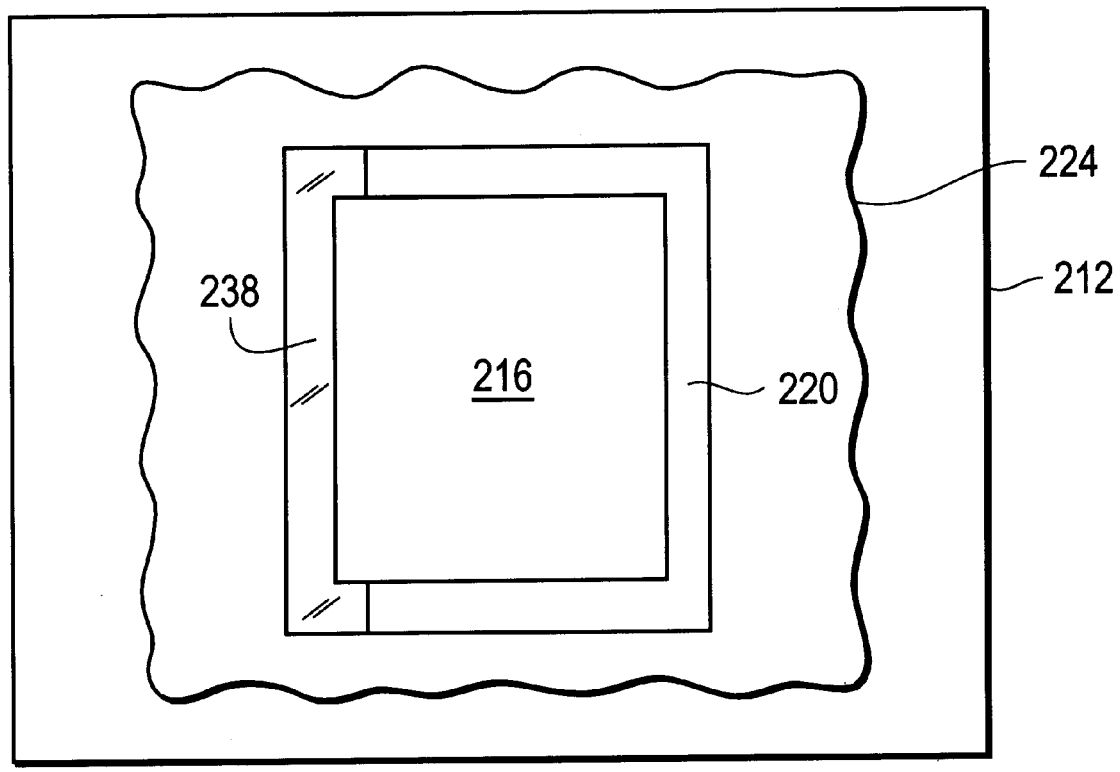
FIG. 2J(ii)

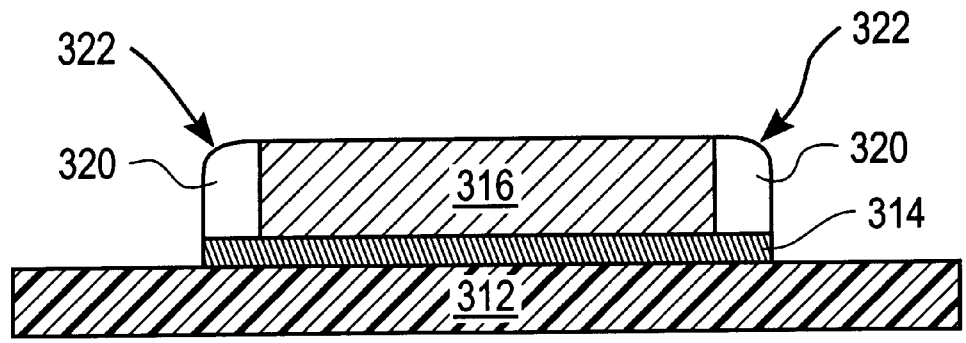
FIG. 3A(i)
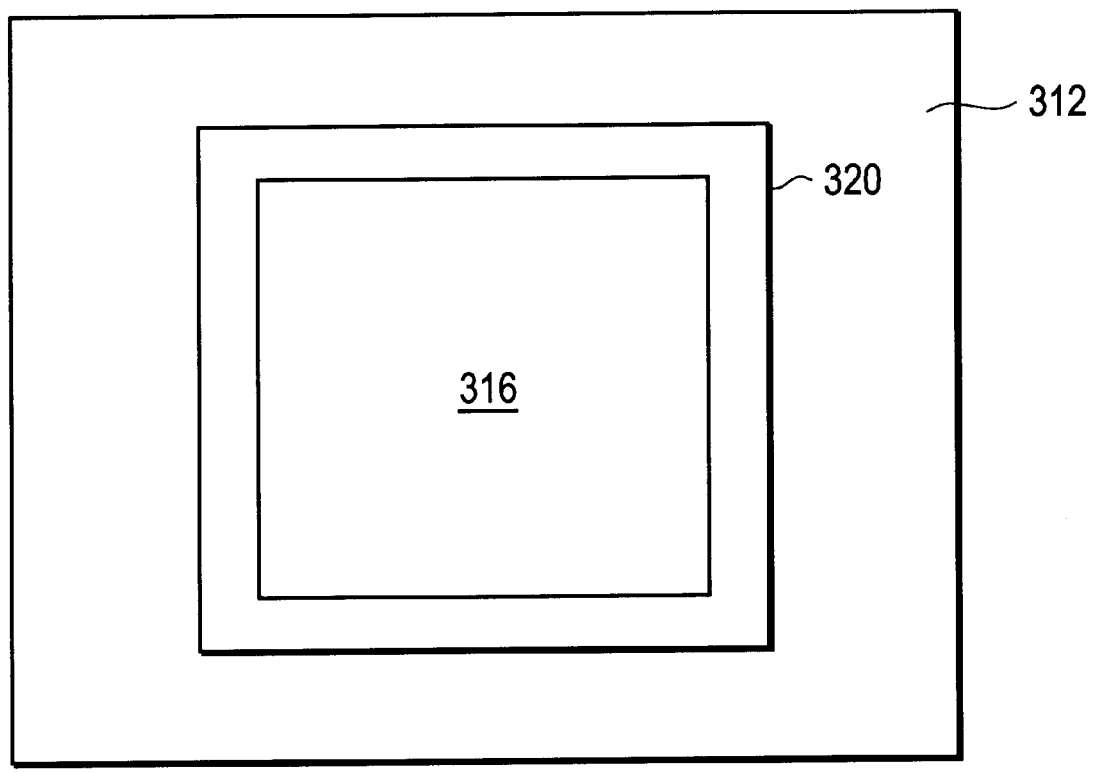
FIG. 3A(ii)

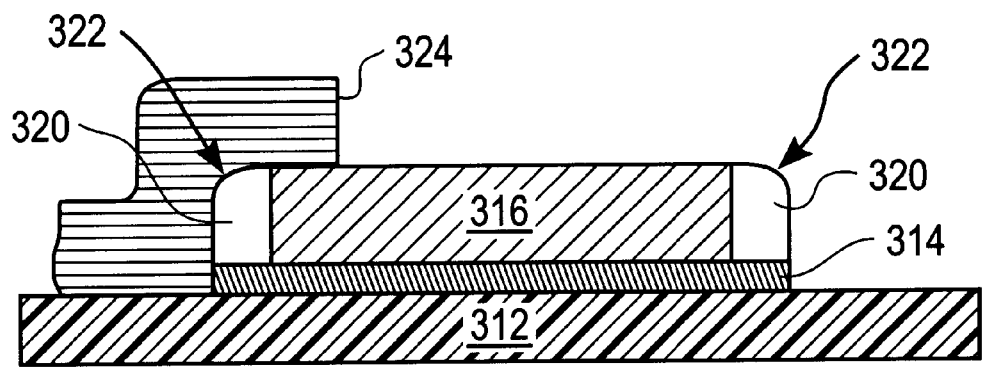
FIG. 3B(i)
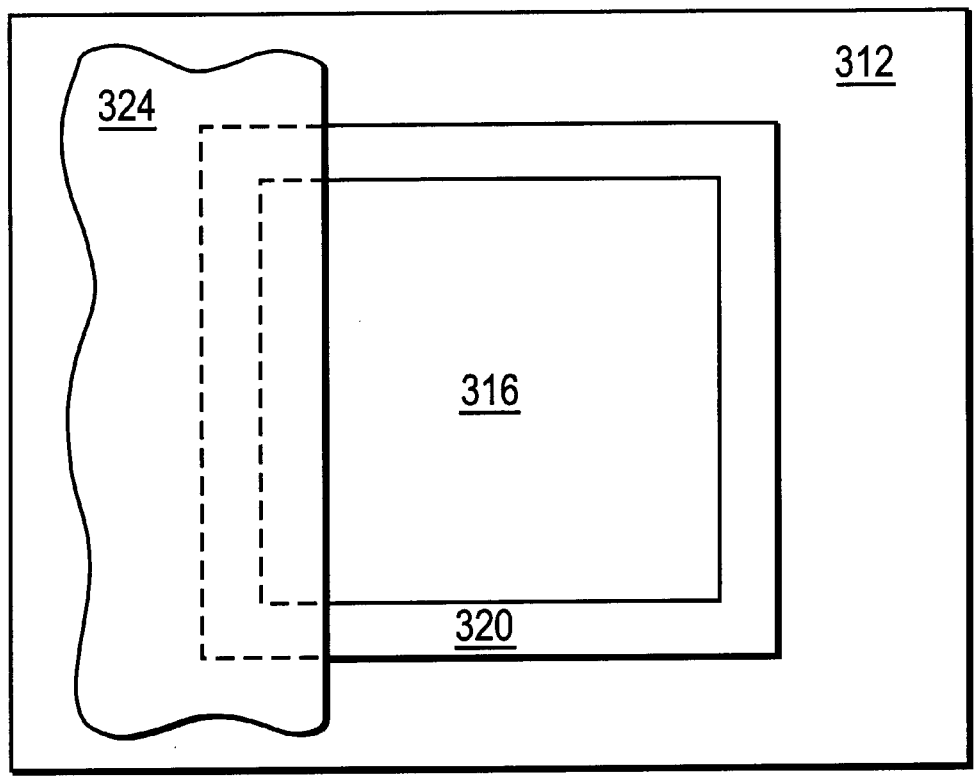
FIG. 3B(ii)

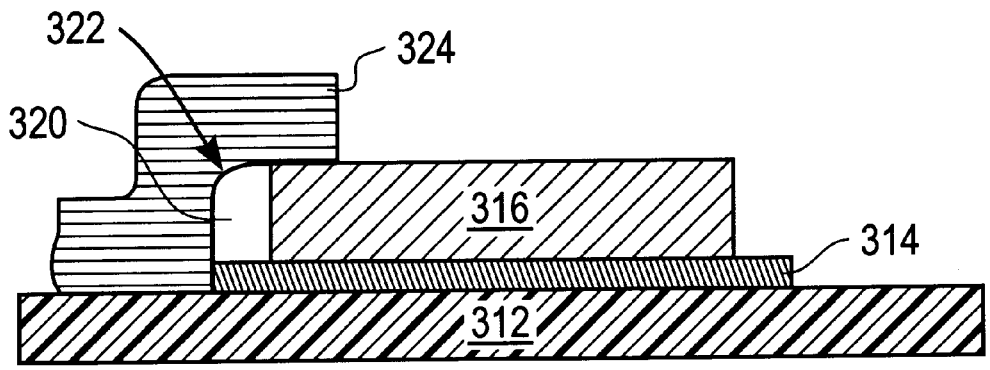
FIG. 3C(i)
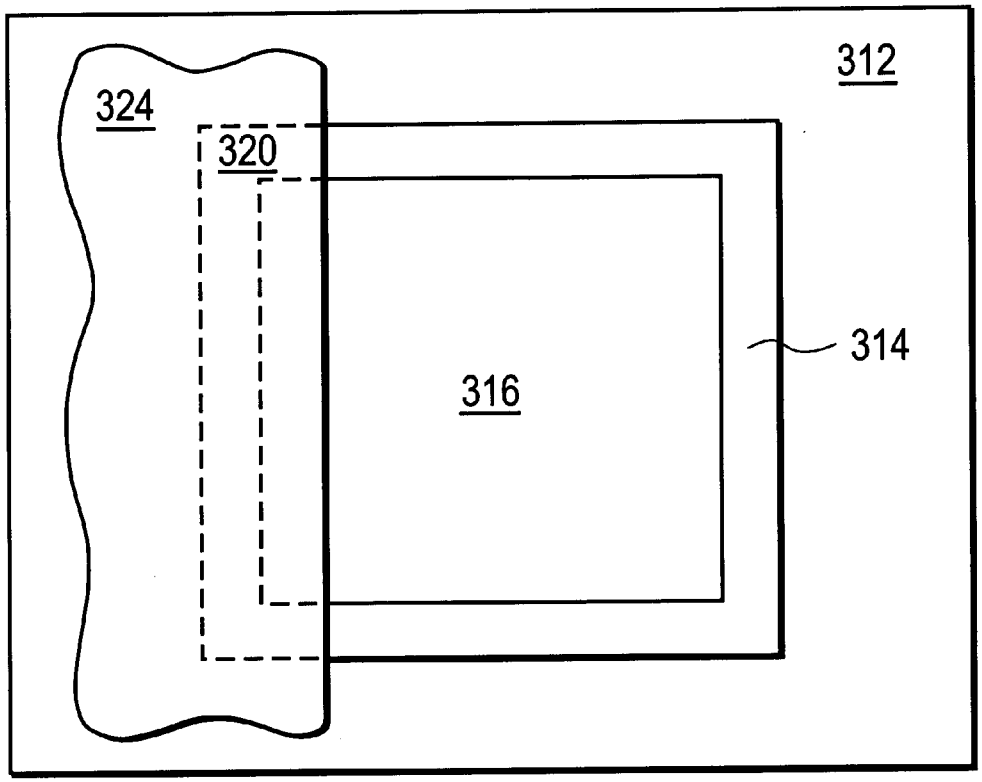
FIG. 3C(ii)

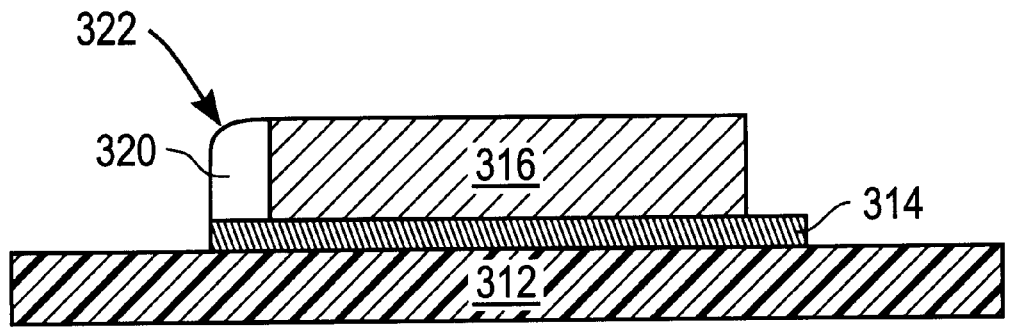
FIG. 3D(i)
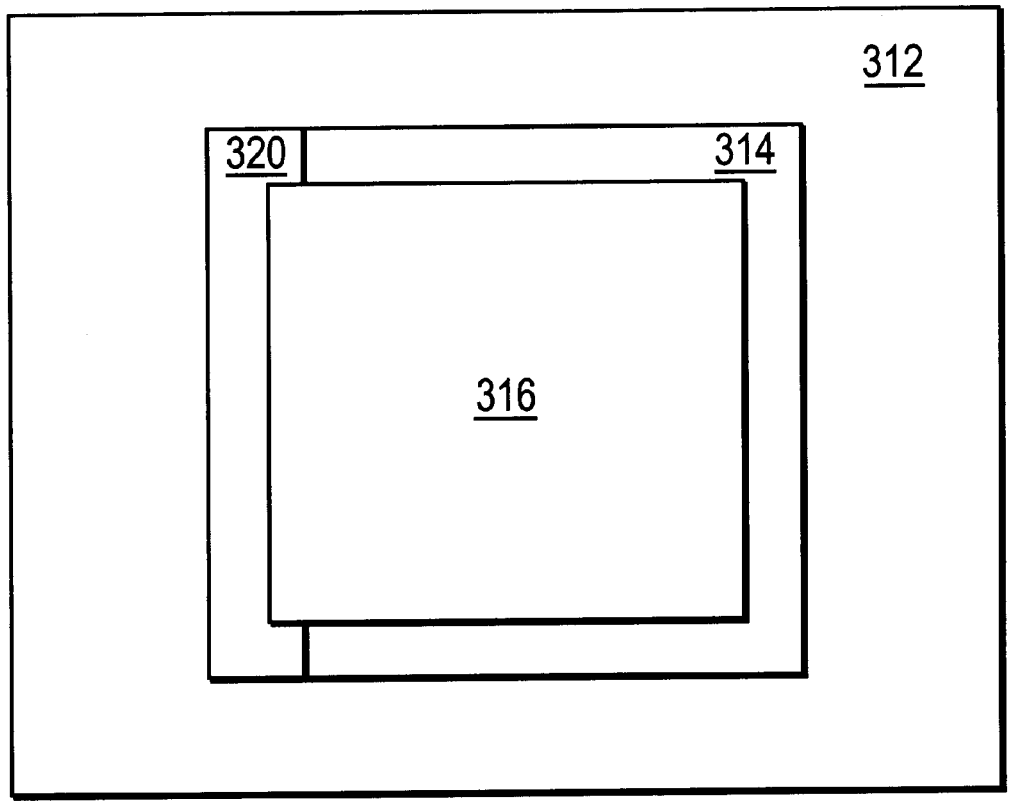
FIG. 3D(ii)

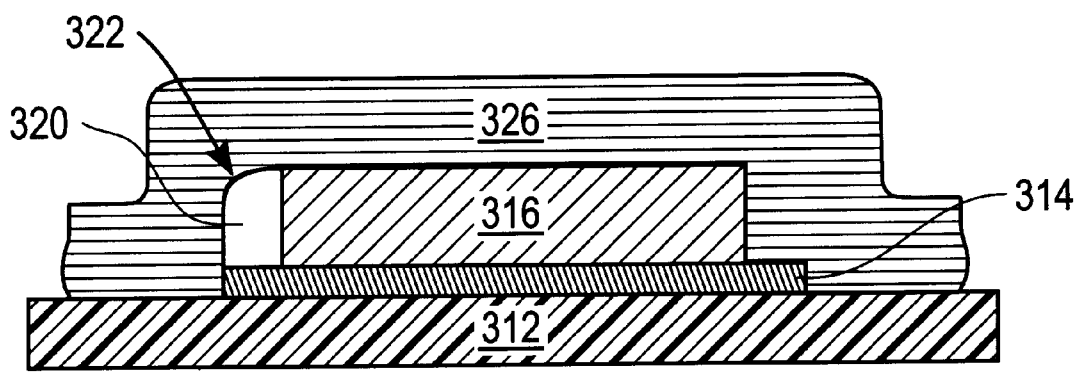
FIG. 3E(i)
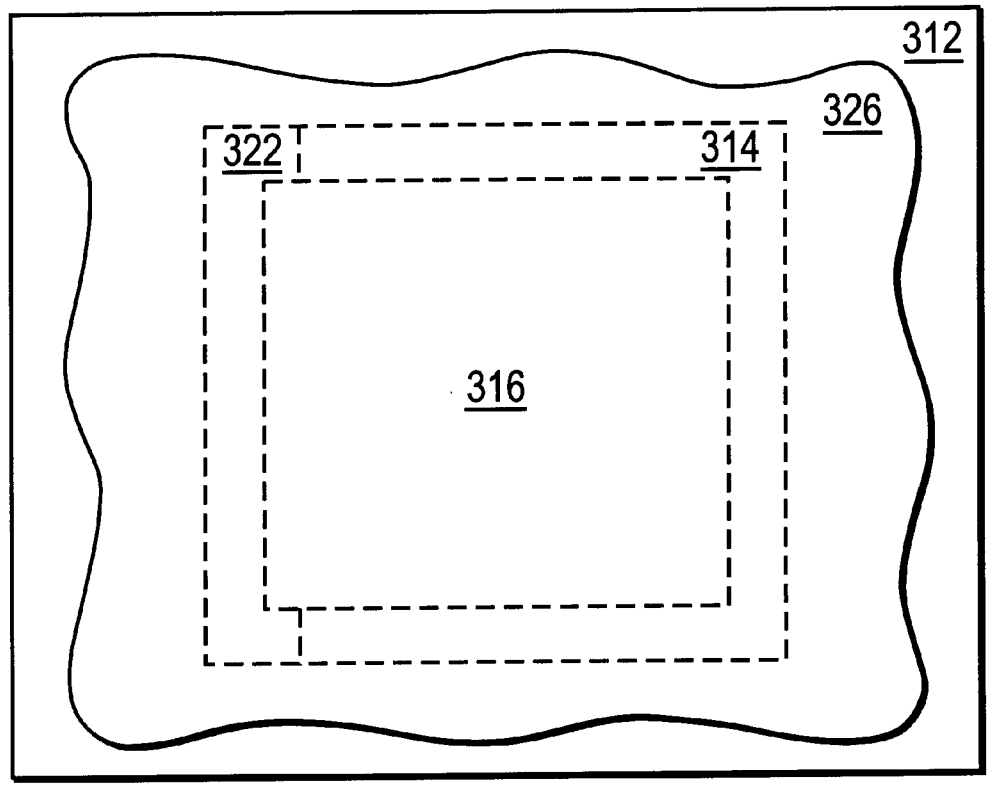
FIG. 3E(ii)

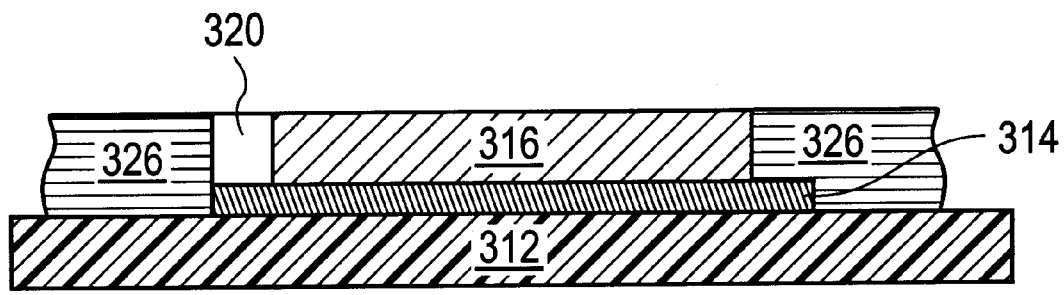
FIG. 3F(i)
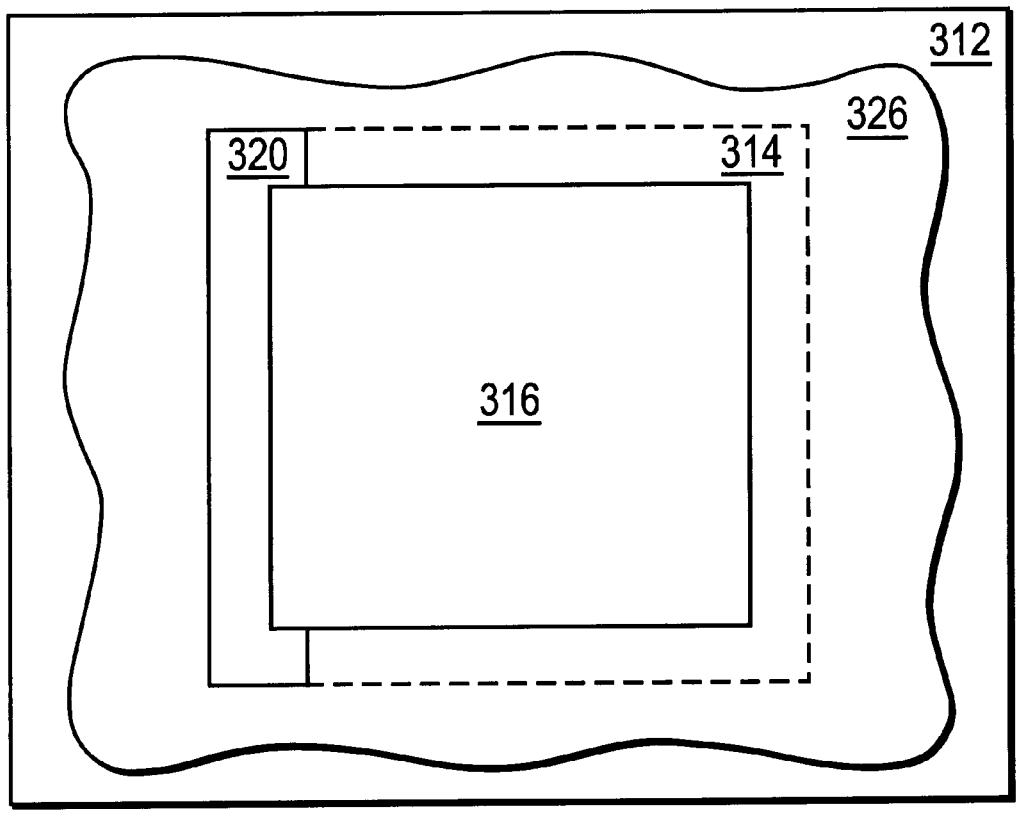
FIG. 3F(ii)

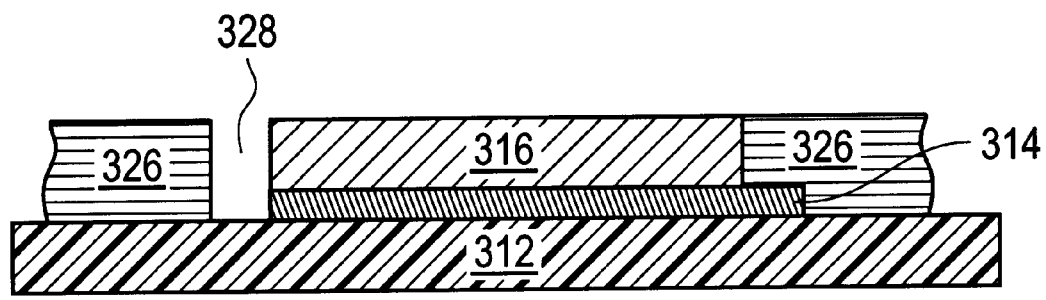
FIG. 3G(i)
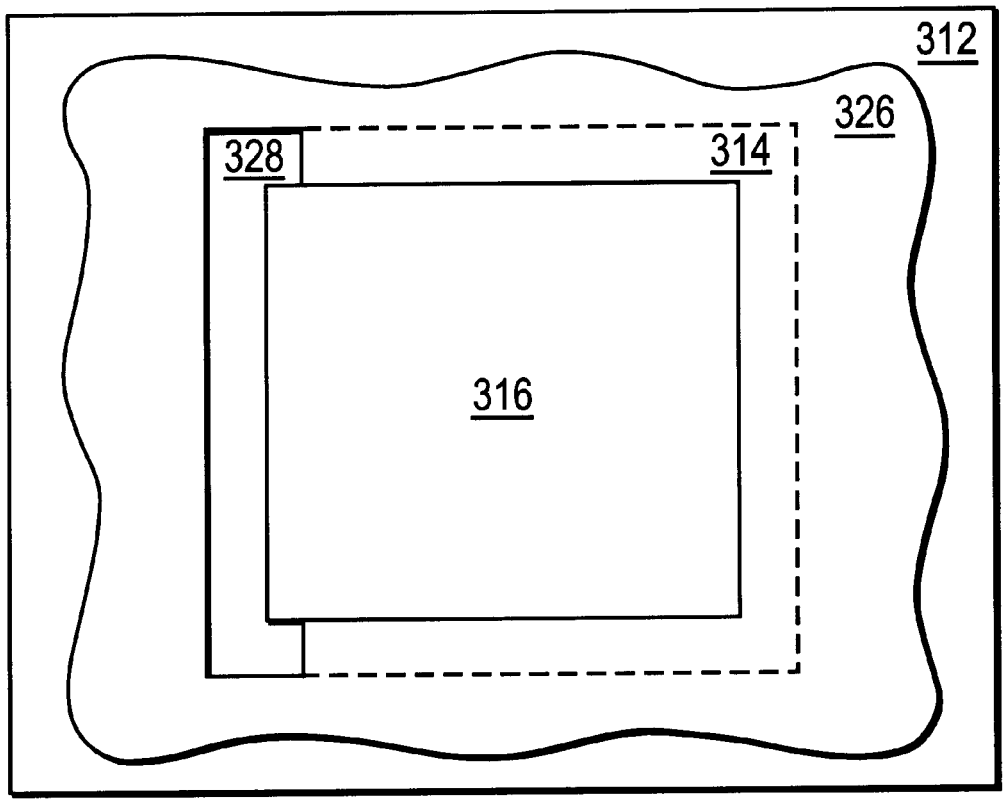
FIG. 3G(ii)

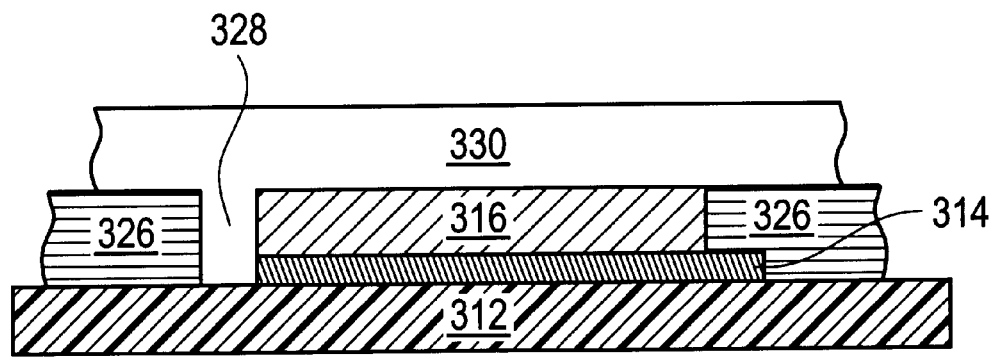
FIG. 3H(i)
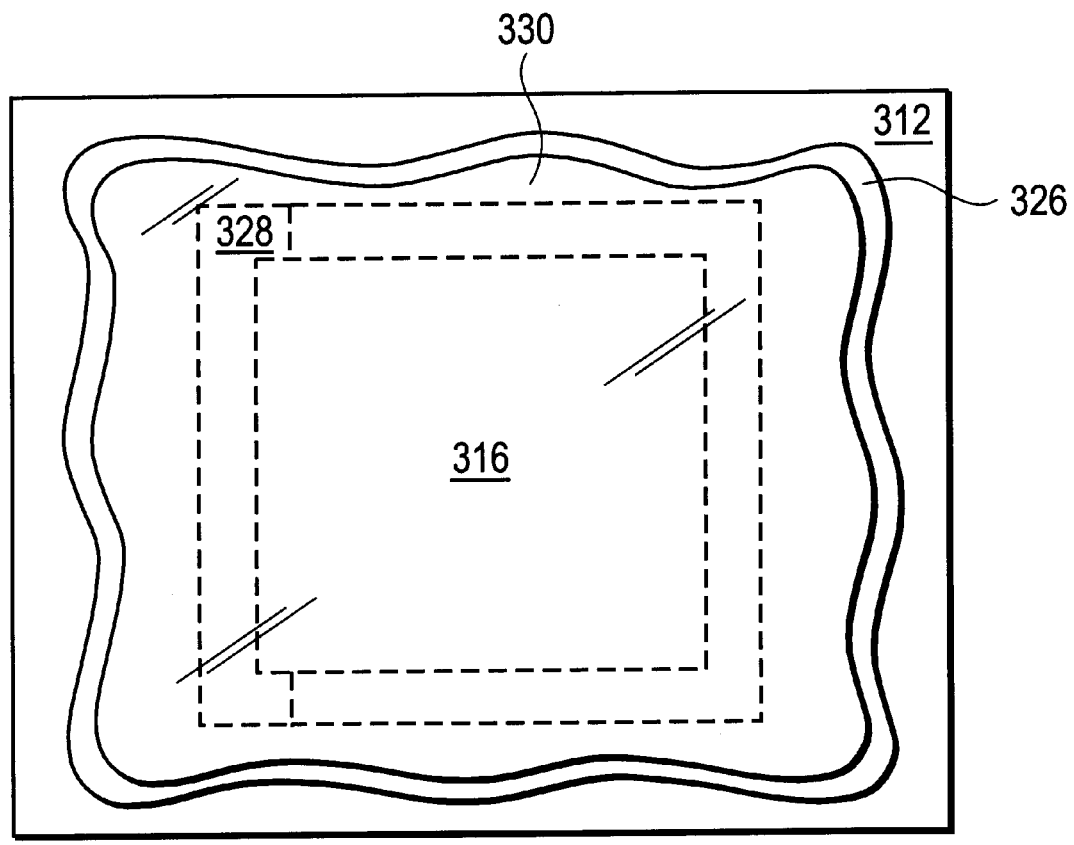
FIG. 3H(ii)

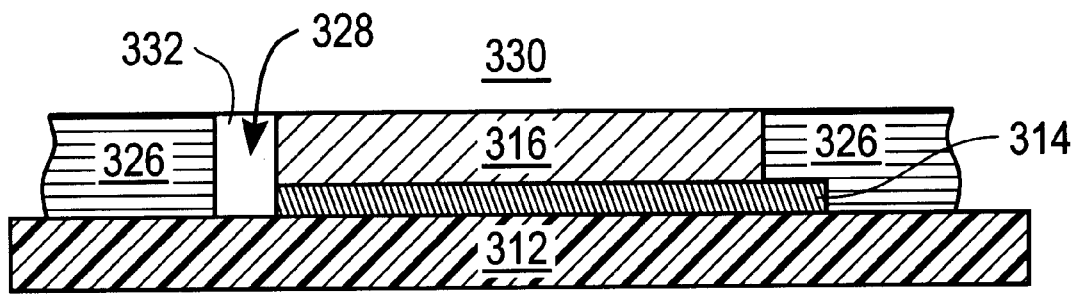
FIG. 3I(i)
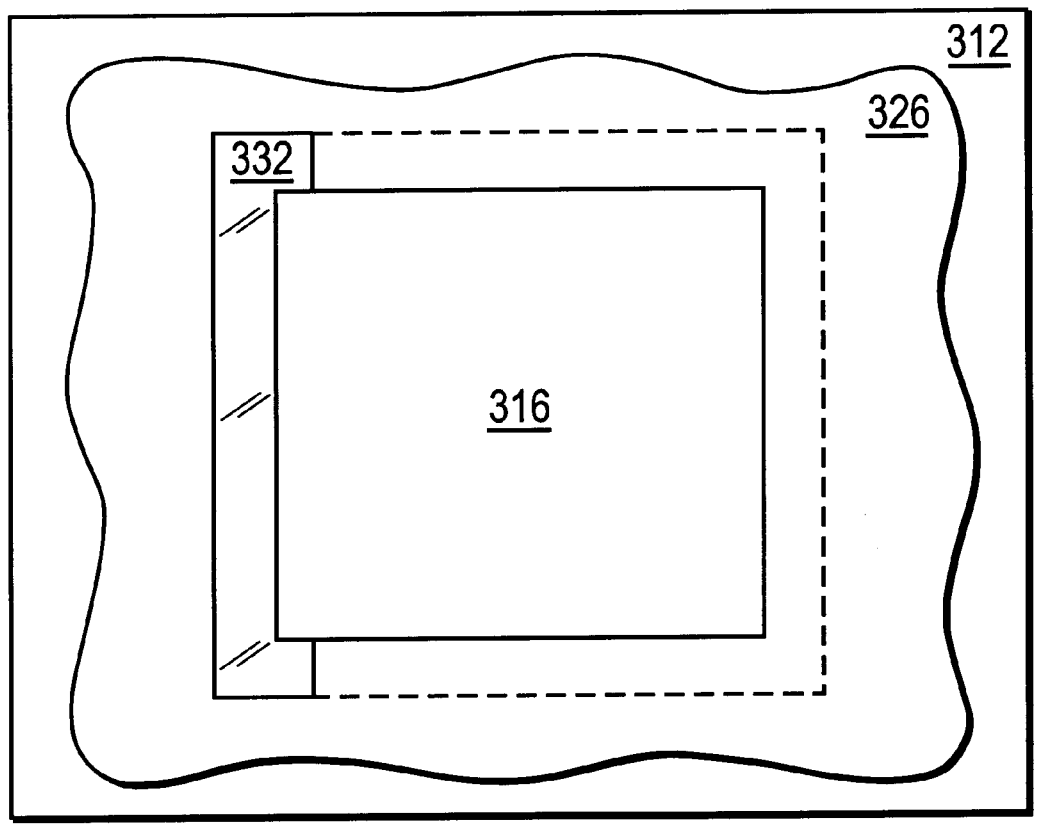
FIG. 3I(ii)

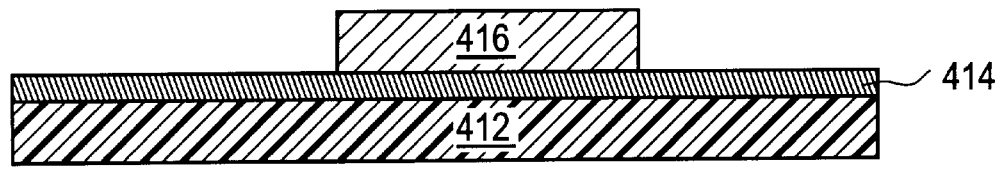
FIG. 4A(i)
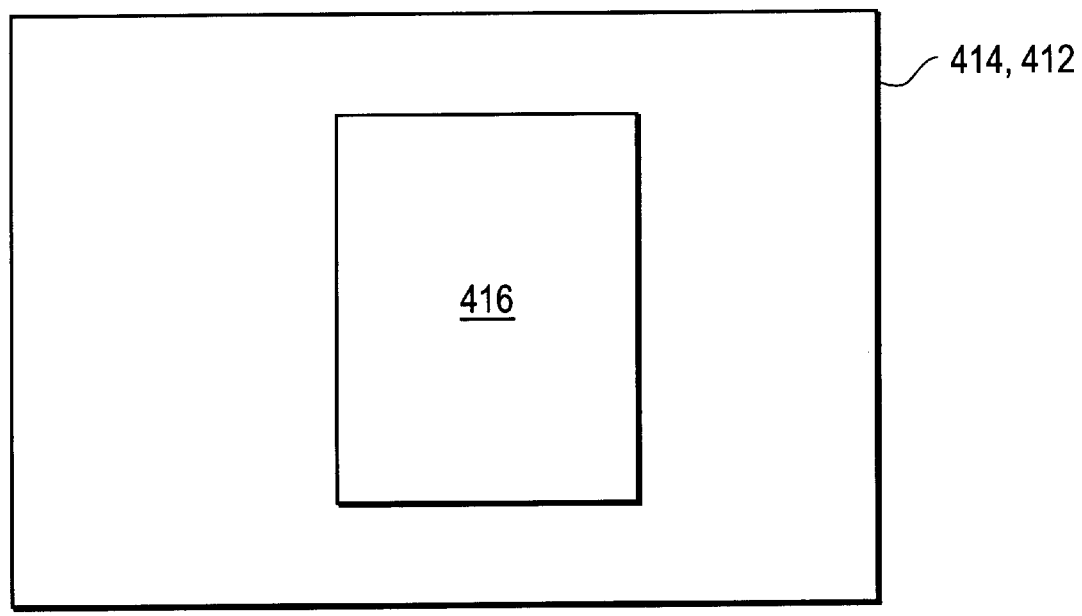
FIG. 4A(ii)

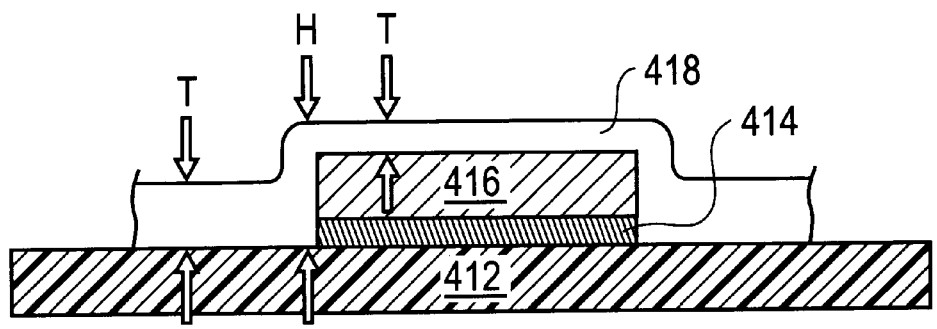
FIG. 4B(i)
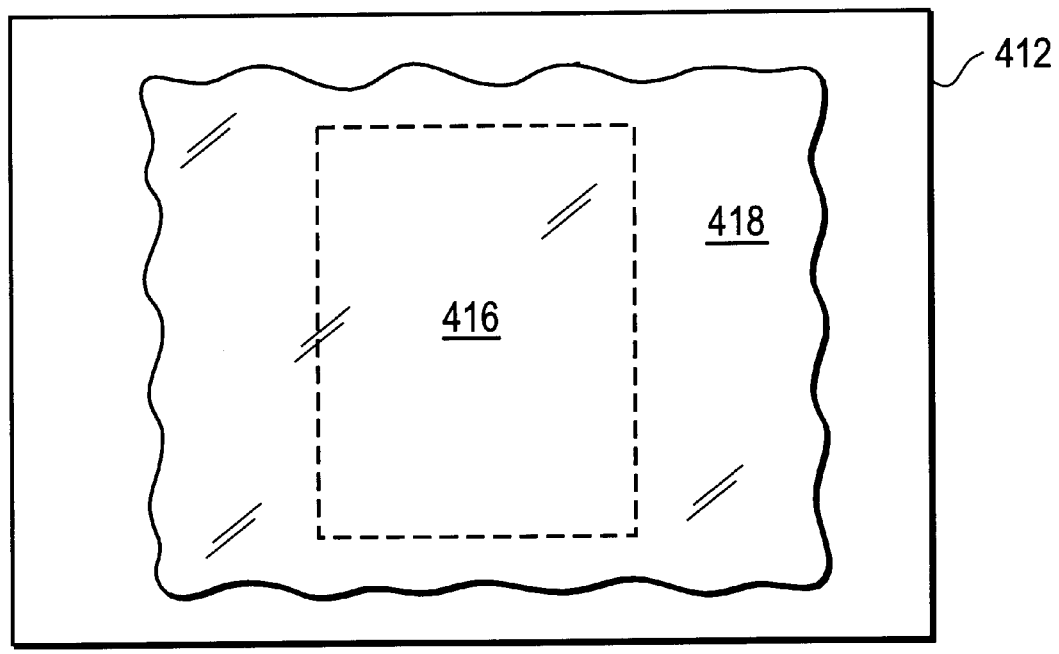
FIG. 4B(ii)

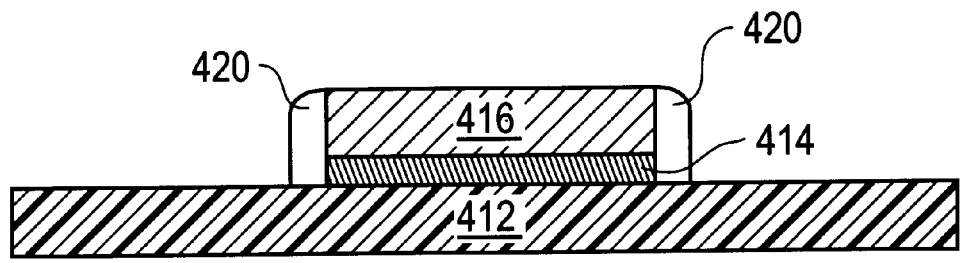
FIG. 4C(i)
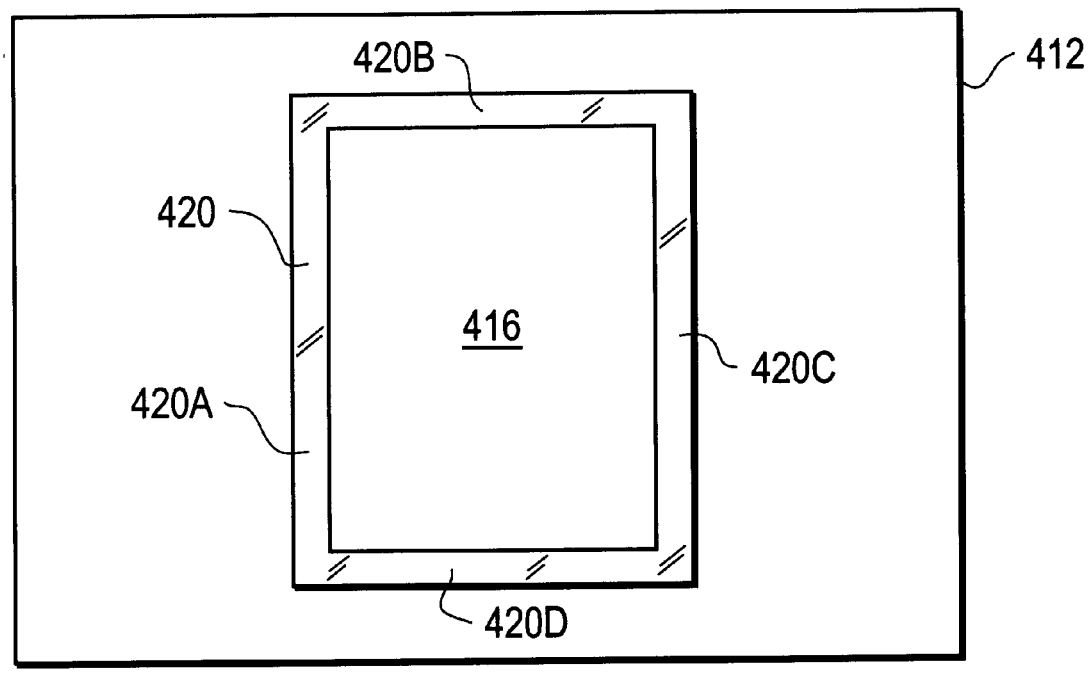
FIG. 4C(ii)

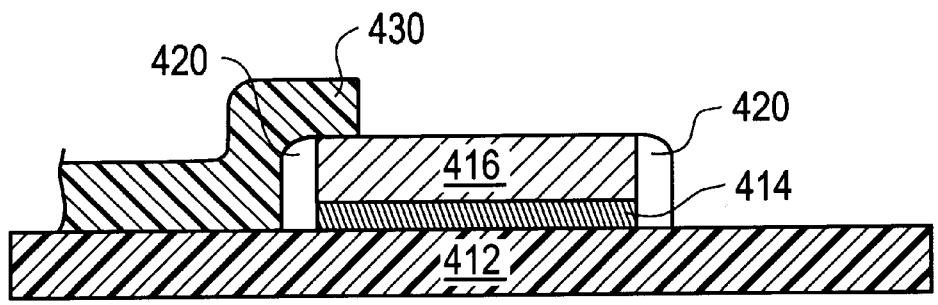
FIG. 4D(i)
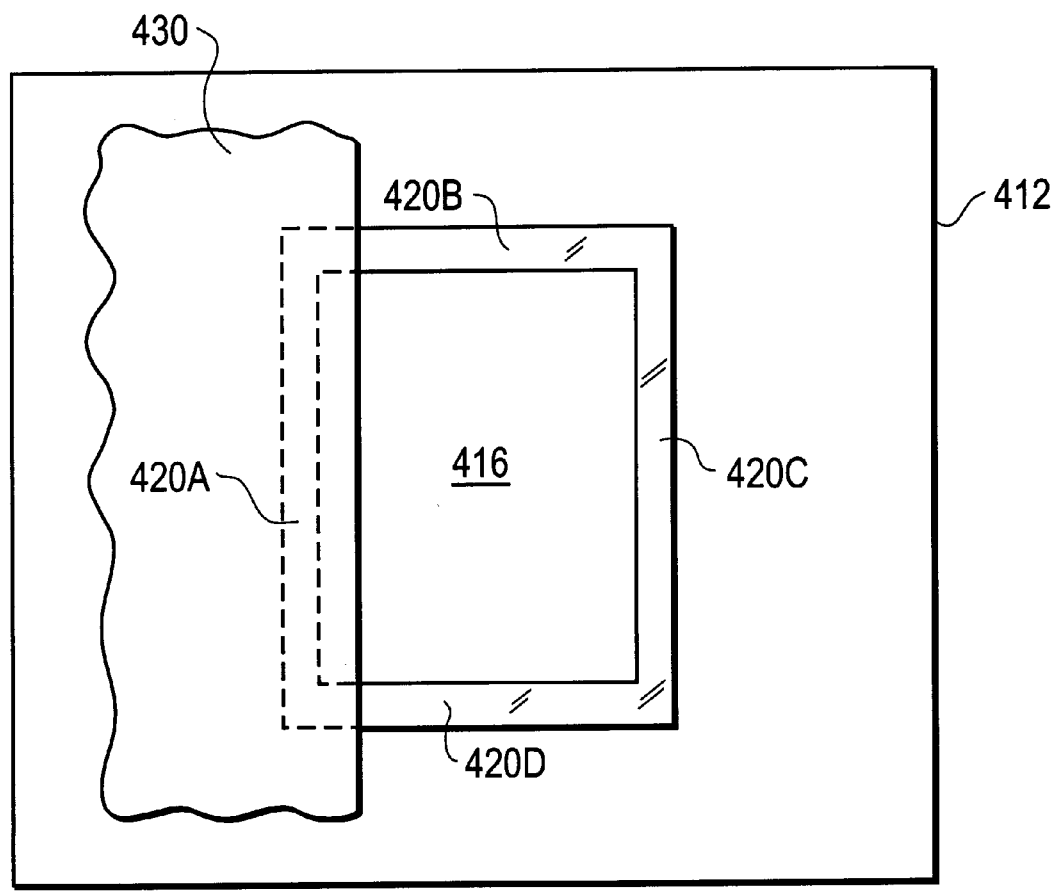
FIG. 4D(ii)

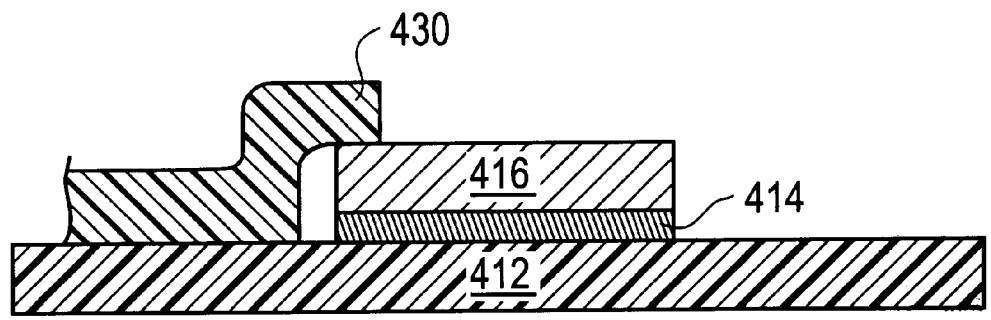
FIG. 4E(i)
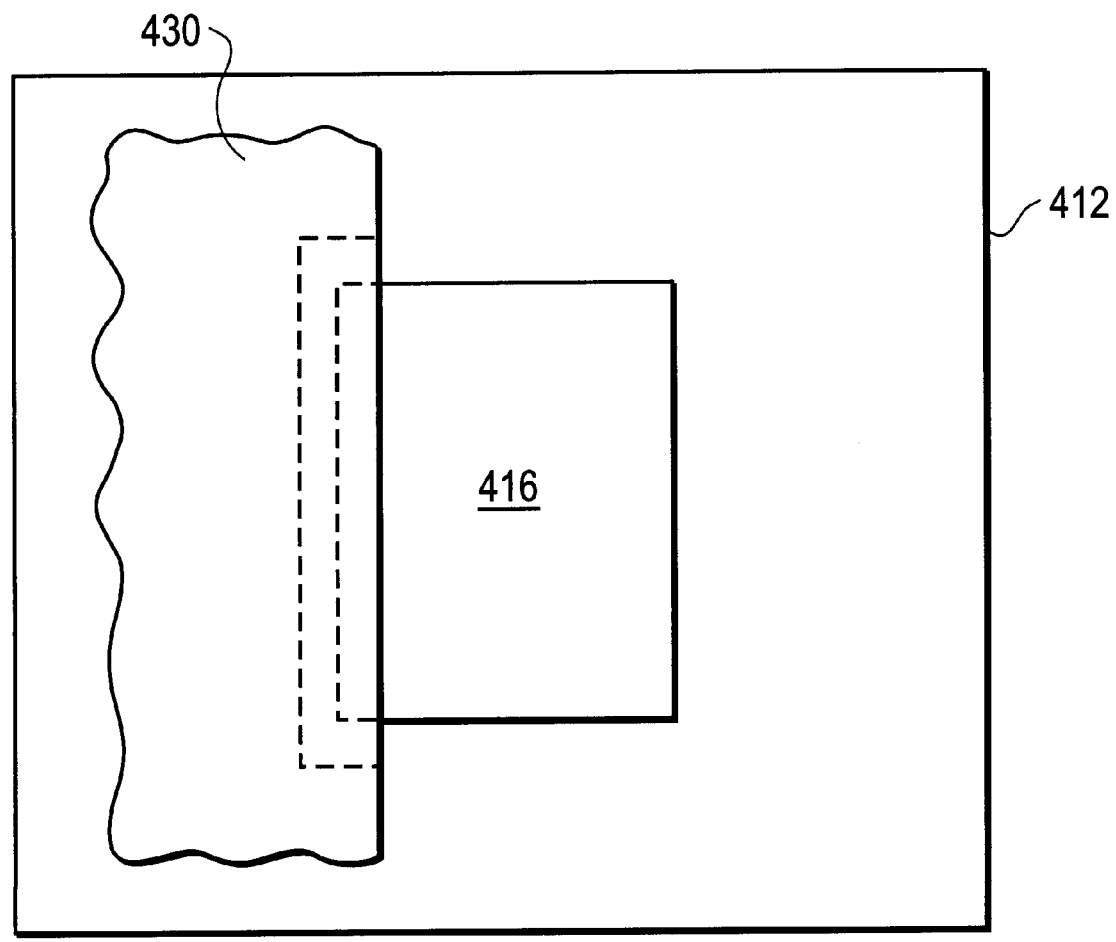
FIG. 4E(ii)

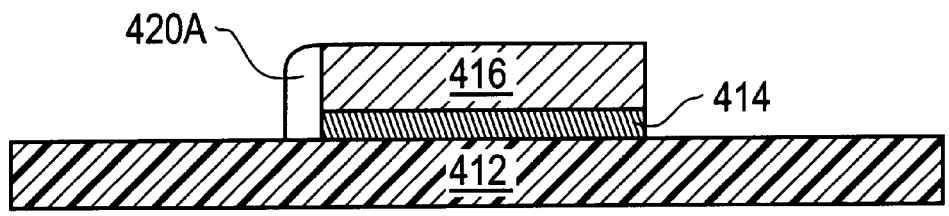
FIG. 4F(i)
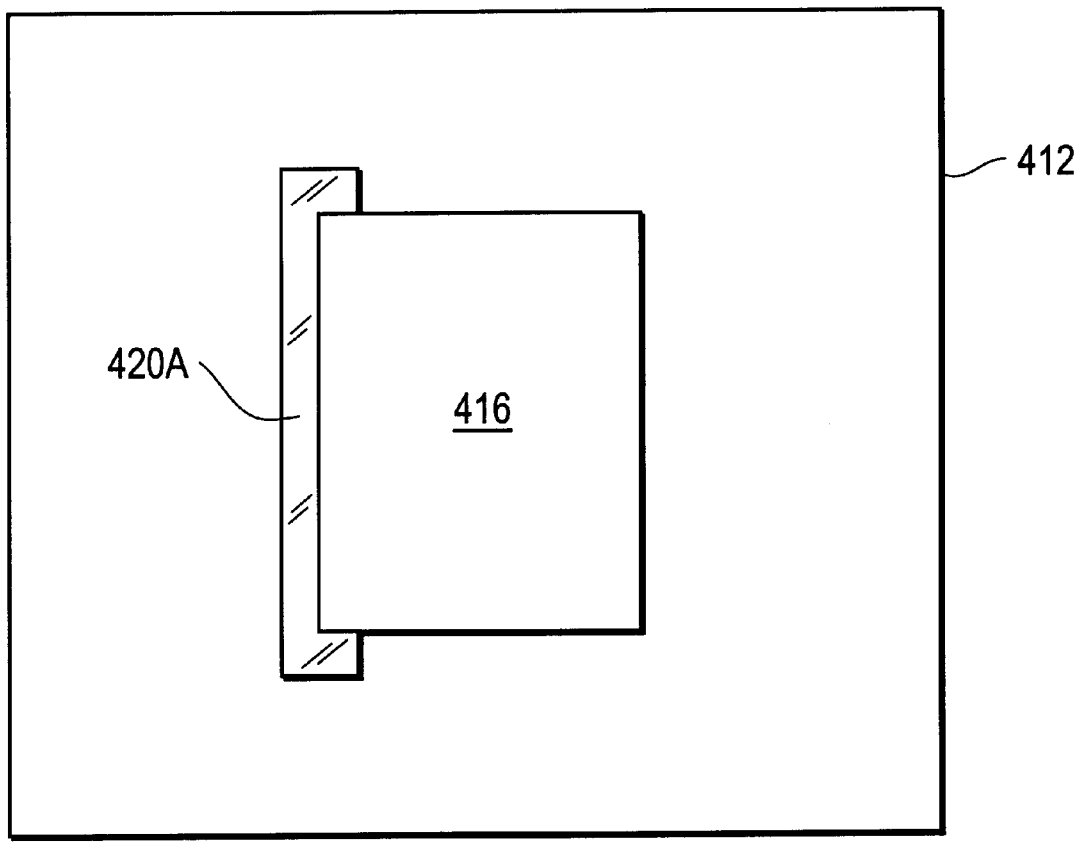
FIG. 4F(ii)

METHOD OF FORMING METAL LINES

BACKGROUND OF THE INVENTION

1). Field of the Invention

This invention relates to a method of forming metal lines utilizing spacer technology.

2). Discussion of Related Art

Integrated circuits are manufactured by forming individual semiconductor electrical elements on a silicon substrate and interconnecting the electrical elements.

The electrical elements may comprise transistors, diodes, capacitors, etc. A dielectric material is deposited over the electrical elements. Conductive vias are formed which extend from contact surfaces of the electrical elements to an upper surface of the dielectric layer. The vias are then interconnected by a network of metal lines.

One method of forming metal lines involves a technique known as photolithography. FIGS. 1A to 1C illustrate such a technique for forming metal lines.

FIG. 1A shows a substrate 108 of the above kind on which a junction layer is deposited. A metal line has to be formed in the junction layer 110. A photoresist layer 112 is deposited on the junction layer 110 and cured. A mask 114 is then positioned some distance above the photoresist layer 112. The mask has opaque and transmissible regions. For purposes of illustration, the mask 114 in FIG. 1A has one or more openings 116 formed therein allowing the light through. A portion 118 of the photoresist layer is then chemically altered by radiating light at a selected frequency through the mask 114.

FIG. 1B shows the structure of FIG. 1A after an etching step. An etchant is used which removes the portion 118 which is chemically altered selectively over the rest of the photoresist layer 112. The resulting photoresist layer 112 has a trench 120 where the portion 118 used to be. The photoresist is known as a positive resist when portions which are irradiated are removed. Negative resists may alternatively be used.

A hole 122 is then etched with the trench 120 providing alignment. The photoresist layer 112 is then stripped. A metal layer is then deposited over the junction layer 110 and in the hole 122, and then polished back to leave a metal line in the hole 122, as shown in FIG. 1C. The metal line's dimensions depend on the way the photoresist layer 112 is photolithographically masked.

One problem with photolithography deals with control over the width of the openings 116 in the mask 114 when the mask 114 is made. A wider opening leads to a wider portion 118 being chemically altered, and to a wider eventual metal line in the hole 122 being formed.

Another problem with photolithography deals with the chemical composition of the photoresist layer 112. Non-uniform curing of the photoresist layer 112 results in variations in the chemical composition in the area of the portion 118 being chemically altered. These variations in chemical composition result in variations in the width of the portion 118, after being chemically altered, and in the width of the eventual metal line in the hole 122.

A further problem with photolithography is that light passing through the mask 114 is subject to diffraction. Diffraction of the light results in the width of the portion 118 being different to the width of the opening 116. The difference in the width of the portion 118 with respect to the width of the opening 116 is difficult to control or accurately determine. The mask 114 may also be spaced from the photoresist layer 112 in a non-uniform manner at different locations so that the width of the portion 118 varies along its length. Such variations in the width of the portion 118 along its length result in variations of the metal line in the hole 122 along its length in a manner generally referred to as "metal line thickness wobble".

The above factors all result in metal lines with widths which are difficult to control. What is therefore required is a method of forming metal lines wherein the widths of the metal lines can be controlled more accurately, especially with respect to prior art techniques of forming metal lines involving photolithography.

SUMMARY OF THE INVENTION

The invention provides a method of forming a metal line. A step is formed on a substrate. According to one method of the invention a metal layer is formed on the substrate and on the step. The metal layer is then etched. A portion of the metal layer remains adjacent the step and the substrate is exposed adjacent the portion of the metal layer.

BRIEF DESCRIPTION OF THE DRAWINGS

The invention is further described by way of examples with reference to the accompanying drawings wherein:

FIG. 2A(i) is a side view of a structure comprising a substrate on which an etch stop layer and a step are formed;

FIG. 2A(ii) is a plan view of the structure of FIG. 2A(i);

FIG. 2B(i) is a side view similar to FIG. 2A(i) after a first layer is deposited;

FIG. 2B(ii) is a plan view of the structure of FIG. 2B(i);

FIG. 2C(i) is a side view similar to FIG. 2B(i) after the fist layer is etched;

FIG. 2C(ii) is a plan view of the structure of FIG. 2C(i);

FIG. 2D(i) is a side view similar to FIG. 2C(i) after a second layer is formed;

FIG. 2D(ii) is a plan view of the structure of FIG. 2D(i);

FIG. 2E(i) is a side view similar to FIG. 2D(i) after a planarization step;

FIG. 2E(ii) is a plan view of the structure of FIG. 2E(i);

FIG. 2F(i) is a side view similar to FIG. 2E(i) after a photoresist layer is formed and patterned;

FIG. 2F(ii) is a plan view of the structure of FIG. 2F(i);

FIG. 2G(i) is a side view similar to FIG. 2F(i) after an etching step;

FIG. 2G(ii) is a plan view of the structure of FIG. 2G(i);

FIG. 2H(i) is a side view similar to FIG. 2G(i) after the photoresist layer is stripped;

FIG. 2H(ii) is a plan view of the structure of FIG. 2H(i);

FIG. 2I(i) is a side view similar to FIG. 2H(i) after a metal layer is deposited;

FIG. 2I(ii) is a plan view of the structure of FIG. 2I(i);

FIG. 2J(i) is a side view similar to FIG. 2I(i) after a planarization step;

FIG. 2J(ii) is a plan view of the structure of FIG. 2J(i);

FIG. 3A(i) is a view of a structure similar to FIG. 2C(i);

FIG. 3A(ii) is a plan view of the structure of FIG. 3A(i);

FIG. 3B(i) is a view similar to FIG. 3(A)(i) after a photoresist layer is formed and patterned;

FIG. 3B(ii) is a plan view of the structure of FIG. 3B(i);

FIG. 3C(i) is a view similar to FIG. 3B(i) after one etching step;

FIG. 3C(ii) is a plan view of the structure of FIG. 3C(i);

FIG. 3D(i) is a view similar to FIG. 3C(i) after the photoresist layer is stripped;

FIG. 3D(ii) is a plan view of the structure of FIG. 3D(i);

FIG. 3E(i) is a view similar to FIG. 3D(i) after a second layer is deposited;

FIG. 3E(ii) is a plan view of the structure of FIG. 3E(i);

FIG. 3F(i) is a view similar to FIG. 3E(i) after one planarization step;

FIG. 3F(ii) is a plan view of the structure of FIG. 3F(i);

FIG. 3G(i) is a view similar to FIG. 3F(i) after another etching step;

FIG. 3G(ii) is a plan view of the structure of FIG. 3G(i);

FIG. 3H(i) is a view similar to FIG. 3G(i) after deposition of a metal layer;

FIG. 3H(ii) is a plan view of the structure of FIG. 3H(i);

FIG. 3I(i) is a view similar to FIG. 3H(i) after another planarization step;

FIG. 3I(ii) is a plan view of the structure of FIG. 3I(i);

FIG. 4A(i) is a side view of a structure comprising a substrate, an etch stop layer and a step;

FIG. 4A(ii) is a plan view of the structure of FIG. 4A(i);

FIG. 4B(i) is a side view similar to FIG. 4A(i) after a metal layer is deposited;

FIG. 4B(ii) is a plan view of the structure of FIG. 4B(i);

FIG. 4C(i) is a side view similar to FIG. 4B(i) after the metal layer is etched;

FIG. 4C(ii) is a plan view of the structure of FIG. 4C(i);

FIG. 4D(i) is a side view similar to FIG. 4C(i) after a photoresist layer is formed and patterned;

FIG. 4D(ii) is a plan view of the structure of FIG. 4D(i);

FIG. 4E(i) is a side view similar to FIG. 4D(i) after an etching step;

FIG. 4E(ii) is a plan view of the structure of FIG. 4E(i);

FIG. 4F(i) is a side view similar to FIG. 4E(i) after the photoresist layer is removed; and FIG. 4F(ii) is a plan view of the structure of FIG. 4F(i).

DESCRIPTION OF THE INVENTION

Figure 1A:
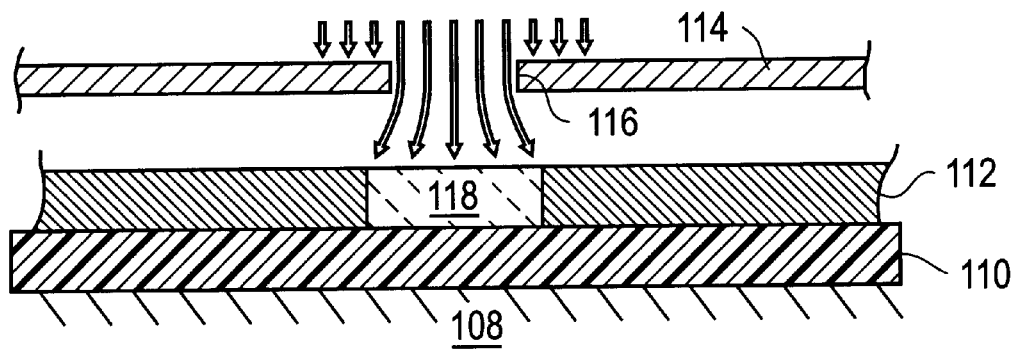
FIG. 1A is a side view which illustrates a prior art photolithographic method of chemically altering a portion of a photoresist layer on a substrate by radiating light through a mask.
Figure 1B:
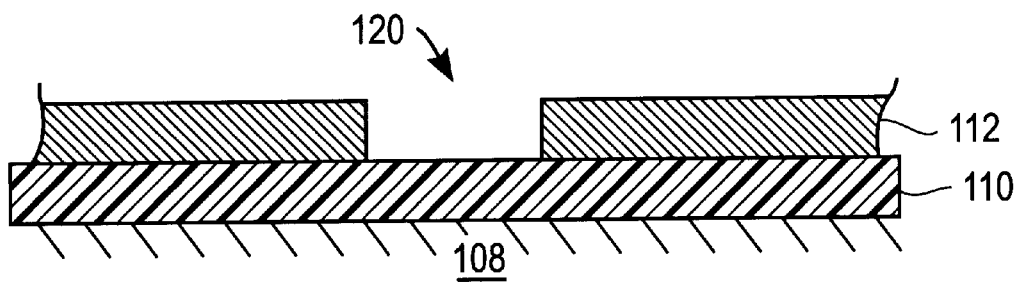
FIG. 1B is a side view of the substrate and the photoresist layer of FIG. 1A after the chemically altered portion is etched out to leave a trench.
Figure 1C:
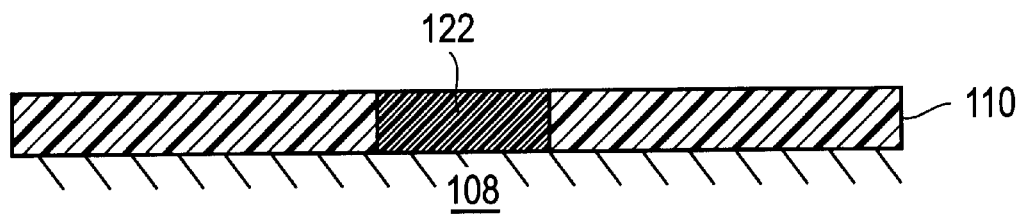
FIG. 1C is a side view of the substrate and the photoresist layer of FIG. 1B after a metal layer is deposited and polished back to leave a metal line in the trench.

A method of forming a metal line or metal lines is described. In the following description, for purposes of explanation, numerous specific details are set forth in order to provide a thorough understanding of the present invention. It will be evident, however, to one skilled in the art, that the present invention may be practiced without these specific details.

In one embodiment an oxide step is formed on a substrate. A first layer comprising nitride is then conformally deposited on the substrate and on the step. The first layer is then etched back to leave a spacer around a periphery of the step. A second layer comprising oxide is then deposited on the substrate, the spacer and the step. The second layer is then planarized to leave the spacer embedded in a surface of the second layer and the step. A portion of the spacer is then etched out to leave a trench. A copper layer is then deposited over the step, the second layer and in the trench. The copper layer is then polished back to leave a metal line in the trench. More complicated networks of interconnected metal lines may also be formed according to this embodiment.

In another embodiment, an oxide step is formed on a substrate. A metal layer is then conformally deposited on the substrate and on the step. The metal layer is then etched back to leave a metal line around a periphery of the step. A portion of the metal line is then etched away to leave only a required portion of the metal line on the substrate. More complicated networks of metal lines may also be formed according to this embodiment.

The invention therefore relates to the formation of metal lines by a technique which is known in the art as "spacer technology". According to spacer technology techniques a layer is formed over a substrate and a step on the substrate and etched back to leave a spacer next to the step. Since existing deposition techniques allow for layers to be deposited to relatively accurate and determinable thicknesses, and existing etch techniques are also relatively controllable, spacers can be formed which have relatively determinable and accurate dimensions. In particular, spacer technology allows for spacers to be formed which have dimensions which are much more accurate than when existing photolithographic techniques are involved.

FIGS. 2A(i) to 2J(ii) illustrate one method of forming a metal line or metal lines according to the invention.

FIG. 2A(i) of the accompanying drawings illustrates a structure comprising a substrate 212, an etch stop layer 214 and a step 216.

The substrate 212 is typically made of silicon. An integrated circuit of semiconductor electrical elements (not shown) are formed below a surface of the substrate. Vias (not shown) extend from the electrical elements to a surface of the substrate 212. The vias have to be interconnected by means of metal lines to complete the formation of the integrated circuit.

The etch stop layer 214 is deposited on the substrate 212 and typically comprises silicon nitride although other materials may alternatively be used. A layer is then deposited on the etch stop layer 214 and patterned, using known photolithographic techniques, to form the step 216. The etch stop layer 214 prevents etching into the substrate 212 during the formation of the step 216. The step 216 may be between 1000 Å and 2500 Å thick and preferably is about 1800 Å thick. The step 216 is typically of an oxide such as silicon dioxide although other materials such as silicon nitride may alternatively be used.

Referring to FIG. 2A(ii), which is a plan view of the structure of FIG. 2A(i), the step 216 has an outline as required by the metal line (or metal lines) which has to be formed on the substrate 212. In the example given the step 216 has a rectangular outline. It should be noted that the step may have an outline other than rectangular. Although the step 216 is a rectangular raised formation, it should also be understood that a step may alternatively be formed out of a layer which defines a rectangular, or other shape, recess. Other shapes or configurations are also possible without departing from the scope of the invention.

FIG. 2B(i) is a view similar to FIG. 2A(i) after a first layer 218 is deposited. The first layer 218 is preferably conformally deposited and covers the step 216 and the etch stop layer 214 on the substrate 212. The first layer 218 typically comprises silicon nitride although other materials such as silicon dioxide may alternatively be used. What is important is that the first layer 218 can be selectively etched over the material of the step 216. The first layer 218 may be formed to a thickness T of between 500 Å and 1500 Å and preferably is formed to a thickness of about 1000 Å on the etch stop layer 214 and the step 216. The first layer 218 has a height H on the etch stop layer 214 immediately adjacent the step 216 which is more than the thickness T on the step 216 on the remainder of the etch stop layer 214. The height H is generally a total of the thickness T of the first layer 218 and the thickness of the step 216.

Referring to FIG. 2B(ii), which is a plan view of the structure of FIG. 2B(i), it can be seen that the first layer 218 covers the entire step 216.

FIG. 2C(i) is a view similar to FIG. 2B(i) after the first layer 218 is etched. An anisotropic etch technique is preferably utilized for etching the first layer 218 selectively over the substrate and the step 216. Etch techniques and etchants used in etching techniques are known in the art. Etching of the first layer 218 exposes the step 216. A portion of the etch stop layer 214 is also removed. A portion of the first layer 218 is not removed leaving a spacer 220 against the step 216. The spacer 220 has a beveled upper and outer corner 222. What is important to note is that etching of the first layer 218 can be controlled with relative accuracy utilizing known etch techniques. The resulting spacer then has dimensions which can be determined with relative accuracy. Widths of spacers of between 50 nm and 150 nm can generally be controlled to a 5 nm 3-σ variation.

Referring to FIG. 2C(ii), which is a plan view of the structure of FIG. 2C(i), it can be seen that the spacer 220 outlines the entire step 216. The spacer 220 thus has four lengths 220A, B, C and D in a rectangular shape.

FIG. 2D(i) is a view similar to FIG. 2C(i) after a second layer 224 is formed on the substrate 212, the spacer 220 and the step 216. The second layer 224 is typically of an oxide such as silicon dioxide although other materials such as silicon nitride may alternatively be used. What is important is that the material of the spacer 220 can be selectively etched over the material of the second layer. The second layer 224 may be between 1000 Å and 2500 Å thick and preferably is about 1800 Å thick.

Referring to FIG. 2D(ii), which is a plan view of the structure of FIG. 2D(i), it can be seen that the second layer 224 covers the entire step 216 and the entire spacer 220.

FIG. 2E(i) is a view similar to FIG. 2D(i) after a planarization step. Planarization may be carried out by a technique generally referred to in the art as chemical-mechanical polishing. Planarization removes an upper region of the second layer 224 above the step 216 and the spacer 220. Planarization is then continued until upper portions of the step 216 and the spacer 220 are removed. Specifically, planarization is continued to below the level of the beveled corner 222 of the spacer 220. The resulting spacer 220 has a substantially vertical outer surface 226.

Referring to FIG. 2E(ii), which is a plan view of the structure of FIG. 2E(i), it can be seen that the substantially rectangular spacer 220 is embedded within the surface of the second layer 224.

FIG. 2F(i) is a view similar to FIG. 2E(i) after a photoresist layer 230 is formed. The photoresist layer 230 is formed over the step 216, the spacer 220 and the second layer 224. The photoresist layer 230 is then patterned, utilizing known photolithographic techniques, so that only a portion of the spacer 220 is exposed.

Referring to FIG. 2F(ii), which is a plan view of the structure of FIG. 2F(i), it can be seen that, in the present embodiment, only one length 220A of the spacer 220 is exposed. In other embodiments more lengths of the spacer 220 may be exposed. It may also be possible to expose two or more different sections of the spacer 220.

FIG. 2G(i) is a view similar to FIG. 2F(i) after an etching step. An etchant is used which selectively removes the material of the spacer 220 over the materials of the second layer 224, the step 216 and the photoresist layer 230. Such etchants are known in the art. The spacer 220 is removed in all areas where the spacer 220 is not masked by the photoresist layer 230, and therefore exposed to the etchant used in the etching step. A trench 232 is left between the step 216 and the second layer 224 after removal of the exposed portion of the spacer 220. The trench 232 typically has an aspect ratio of between 2 and 3. As previously mentioned, the width of the spacer 220 can be determined with relative accuracy. The width of the trench 232 is the same as the width of the spacer 220. The width of the trench 232 is therefore also relatively accurately determinable.

Referring to FIG. 2G(ii), which is a plan view of the structure of FIG. 2G(i), it can be seen that only one length (220A) of the spacer 220 is removed to leave the trench 232 behind. The other three lengths 220B, C and D of the spacer 220 are left intact behind the photoresist layer 230.

FIG. 2H(i) is a view similar to FIG. 2G(i) after the photoresist layer 230 is stripped.

Referring to FIG. 2H(ii), which is a plan view of the structure of FIG. 2H(i), it can be seen that the three remaining sections 220B, C and D of the spacer are embedded in the second layer 224 and that a trench 232 is formed in the second layer 224.

FIG. 2I(i) is a view similar to FIG. 2H(i) after a metal layer 234 is deposited. The metal layer 234 is preferably of copper, although other metals such as aluminum, tungsten, gold or silver may alternatively be used. The metal layer 234 is typically deposited in a damascene process utilizing a blanket sputter deposition process. The metal layer 234 covers the second layer 224, the step 216 and the remaining portions of the spacer 220. The metal layer 234 also fills the trench 232.

Referring to FIG. 2I(ii), which is a plan view of the structure of FIG. 2I(i), it can be seen that the metal layer 234 fills the entire length of the trench 232 and covers all the remaining portions of the spacer 220.

FIG. 2J(i) is a view similar to FIG. 2I(i) after a planarization step. Planarization may be carried out in a technique known in the art as chemical-echanical polishing. Planarization is continued until the metal layer 234 is removed from the step 216, the spacer 220 and the second layer 224. A metal line 238 is left behind in the trench 232 after the planarization step is completed. As mentioned previously, the width of the trench 232 is determined with relative accuracy by the spacer 220. The metal line 238 therefore also has a width which is relatively determinable. As with the spacer 220, a metal line 238 with a width of between 50 nm and 150 nm can generally be controlled to a 5 nm 3-σ variation in width.

Referring to FIG. 2J(ii), which is a plan view of the structure of FIG. 2J(i), it can be seen that the metal line 238 is formed in the region of the trench 232.

FIGS. 3A(i) to 3I(ii) disclose an alternate method of masking a spacer.

FIG. 3A(i) is a view of a structure similar to the structure shown in FIG. 2C(i). The structure in FIG. 3A(i) therefore includes a substrate 312, an etch stop layer 314, a step 316, and a spacer 320 having an outer corner 322.

FIG. 3A(ii) is a plan view of the structure of FIG. 3A(i), similar to FIG. 2C(ii).

FIG. 3B(i) is a view of the structure of FIG. 3A(i) after a photoresist layer 324 is deposited and patterned. The final layer only covers areas of the spacer 320 where an eventual metal line is to be formed.

Referring to FIG. 3B(ii), which is a plan view of the structure of FIG. 3A(i), it can be seen that only one length of the space 320 is covered by the photoresist layer and three lengths of the photoresist layer are exposed.

FIG. 3C(i) is a view of the structure of FIG. 3B(i) after an etching step. An etchant is used which selectively removes the material of the spacer 320 over the materials of the photoresist layer 324 and the material of the step 316. The etching step removes the exposed lengths of the spacer 320 while leaving the length of the spacer 320 which is covered by the photoresist layer intact.

Referring to FIG. 3C(ii), which is a plan view of the structure of FIG. 3C(i), it can be seen that only the portion of the spacer 320 below the photoresist layer 324 remains after the etching step.

FIG. 3D(i) is a view similar to FIG. 3C(i), after the photoresist layer is stripped, leaving only the spacer 320 and the step 316 standing above the substrate 312.

FIG. 3D(ii) is a plan view of the structure of FIG. 3D(i), showing the positioning of the exposed spacer 320.

FIG. 3E(i) is a view similar to FIG. 3D(i), after a second layer 326 is deposited. The second layer covers the substrate 312, the remaining spacer 320 and the step 316.

Referring to FIG. 3E(ii), which is a plan view of the structure of FIG. 3E(i), it can be seen that the second layer 326 totally covers the step 316 and the spacer 322.

FIG. 3F(i) is a view similar to FIG. 3E(i) after a planarization step which may be carried out by a chemical-mechanical polishing step. The planarization step removes material of the second layer so as to expose the step 316 and the spacer 320. Planarization is continued until the corner 322 of the spacer is removed.

Referring to FIG. 3F(ii), which is a plan view of the structure of FIG. 3F(i), it can be seen that a structure is formed wherein the remaining spacer 320 is embedded in within a surface of the step 316 and the second layer 326.

FIG. 3G(i) is a view similar to FIG. 3F(i) after another etching step. An etchant is used which removes the material of the spacer 320 selectively over the materials of the step 316 and the second layer 326. A portion of the etch stop layer 314 below the spacer 320 is also removed, utilizing an etchant which selectively removes the material of the etch stop layer.

Referring to FIG. 3G(ii), which is a plan view of the structure of FIG. 3G(i), it can be seen that a trench 328 remains within the surfaces of the step 316 and the second layer 326 in an area where the remaining spacer previously used to be.

FIG. 3H(i) is a view similar to FIG. 3G(i) after a metal layer 330 is deposited. The metal layer covers the second layer 326 and the step 316 and fills the trench 328.

FIG. 3H(ii) is a plan view of the structure of FIG. 3H(i).

FIG. 3I(i) is a view similar to FIG. 3H(i) after another planarization step which may also be carried out utilizing a chemical-mechanical polishing step. Planarization is continued until the metal on the step 316, and the second layer 326 are removed. After planarization a metal line 332 remains within the trench 328.

Referring to FIG. 3I(ii), which is a plan view of the structure of FIG. 3I(i), it can be seen that the metal line is formed in an area which was originally masked by the photoresist layer 324 (see FIG. 3C(ii)).

FIGS. 4A(i) to 4F(ii) illustrate another method of forming a metal line or metal lines according to the invention.

FIG. 4A(i) of the accompanying drawings illustrates a structure comprising a substrate 412, an etch stop layer 414 and a step 416.

The substrate 410 is typically made of silicon. An integrated circuit of semiconductor electrical elements (not shown) are formed below a surface of the substrate. Vias (not shown) extend from the electrical elements to a surface of the substrate 410. The vias have to be interconnected by means of metal lines to complete the formation of the integrated circuit.

The etch stop layer 414 is deposited on the substrate 412 and typically comprises silicon nitride although other materials may alternatively be used. A layer is deposited on the etch stop layer 414 and patterned, using known photolithographic techniques, to form the step 416. The etch stop layer 414 prevents etching into the substrate 412 during the formation of the step 416. The step 416 may be between 1000 Å and 2500 Å thick and preferably is about 1800 Å thick. The step is preferably of an oxide such as silicon dioxide although other materials such as silicon nitride may alternatively be used.

Referring to FIG. 4A(ii), which is a plan view of the structure of FIG. 4A(i), the step 416 has an outline as required by the metal line (or metal lines) which has to be formed on the substrate 412. In the example given the step 416 has a rectangular outline. It should be noted that the step 416 may have an outline other than rectangular. Although the step 416 is a rectangular raised formation, it should also be understood that a step may, alternatively, be formed by a layer defining a rectangular, or other shape, recess. Other shapes or configurations are also possible without departing from the scope of the invention.

FIG. 4B(i) is a view similar to FIG. 4A(i) after exposed portions of the etch stop layer 414 are etched out using a selective etch and after a metal layer 418 is deposited. The metal layer 418 is preferably conformally deposited and covers the step 416 and the substrate 412. The metal layer 418 is preferably of aluminum, although other metals such as copper, tungsten, gold or silver may alternatively be used. The metal layer 418 is typically deposited in a damascene process utilizing a blanket sputter deposition process. The metal layer 418 may be deposited to a thickness T of between 500 Å and 1500 Å and preferably is deposited to a thickness of about 1000 Å on the step 416 and on the substrate 412. The metal layer 418 has a height H on the substrate 412 immediately adjacent the step 416 which is more than the thickness T on the step 416 on the remainder of the substrate 412. The height H is generally a total of the thickness T of the metal layer 418 and the thickness of step 416.

Referring to FIG. 4B(ii), which is a plan view of the structure of FIG. 4B(i), it can be seen that the metal layer 418 covers the entire step 416.

FIG. 4C(i) is a view similar to FIG. 4B(i) after the metal layer 418 is etched. An anisotropic etch technique is preferably utilized for etching the metal layer 418 selectively over the substrate 412 and the step 416. Such etch techniques and etchants used in etch techniques are known in the art. Etching of the metal layer exposes the step 416 and the substrate 412. A portion of the metal layer is not removed leaving a metal line 420 against the step 416. What is important to note is that etching of the metal layer 418 can be controlled with relative accuracy utilizing known etch techniques. The resulting metal line therefore has dimensions which can be controlled with relative accuracy. Applicant has found that widths of metal lines between 50 nm and 150 nm can be controlled to 5 nm 3-σ variation.

Referring to FIG. 4C(ii), which is a plan view of the structure of FIG. 4C(i), it can be seen that the metal line 420 outlines the entire step 416. The metal line 420 thus has three lengths 420A, B, C and D in a rectangular shape.

FIG. 4D(i) is a view similar to FIG. 4C(i) after a photoresist layer 430 is formed. The photoresist layer 430 is formed on the substrate 412, the metal line 420 and the step 416. The photoresist layer 430 is then patterned, utilizing known photolithographic techniques, so that only a portion of the metal line 420 is exposed.

Referring to FIG. 4D(ii), which is a plan view of the structure 410 of FIG. 4D(i), it can be seen that only one length 420A of the metal line 420 is covered. In other embodiments more lengths of the metal line 420 may be covered. It may also be possible to cover two or more different sections of the metal line 420.

FIG. 4E(i) is a view similar to FIG. 4D(i) after an etching step. An etchant is used that selectively etches the material of the metal line 420 over the materials of the photoresist layer 430, the substrate 412, and the step 416. Such etchants are known in the art. The metal line 420 is removed by the etching step in all areas where it is not masked by the photoresist layer 430 and, therefore exposed to the etchant used in the etching step.

Referring to FIG. 4E(ii), which is a plan view of the structure of FIG. 4E(i), it can be seen that only one length (420A) of the metal line 420 is left intact behind the photoresist layer 430. The other lengths 420 B, C and D of the metal line 420 are removed.

FIG. 4F(i) is a view similar to FIG. 4E(i) after the photoresist layer 430 is stripped.

Referring to FIG. 4F(ii), which is a plan view of the structure 410 of FIG. 4F(i), it can be seen that only the length 420A of the original metal line 420 remains on the substrate 412. As previously discussed, the width of the length 420A can be controlled with relative accuracy utilizing the aforedescribed method of the invention.

Thus a method of forming a metal line or metal lines on a substrate is described. While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed:

1. A method of forming a metal line on a substrate, comprising:

forming a step on the substrate;

forming a first layer on the substrate and on the step;

etching the first layer to form a spacer next to the step;

forming a second layer next to the spacer;

removing the spacer to leave a trench; and forming a metal layer in the trench.

2. The method as in claim 1 wherein the step is an oxide.

3. The method as in claim 1 wherein the step is between 1000 Å and 2500 Å thick.

4. The method as in claim 1 wherein the step is about 1800 Å thick.

5. The method as in claim 1 wherein the first layer is silicon nitride.

6. The method as in claim 1 wherein the first layer is between 500 Å and 1500 Å thick.

7. The method as in claim 1 wherein the first layer is about 1000 Å thick.

8. The method as in claim 1 wherein the first layer is conformally deposited.

9. The method as in claim 1 wherein the first layer is anisotropically etched.

10. The method as in claim 1 wherein the second layer is formed over the step and the spacer, whereafter the second layer is planarized to expose the spacer.

11. The method as in claim 10 wherein the spacer is partially planarized.

12. The method as in claim 1 wherein the second layer is an oxide.

13. The method as in claim 1 wherein the second layer is between 1000 Å and 2500 Å thick.

14. The method as in claim 1 wherein the second layer is about 1800 Å thick.

15. The method as in claim 1 wherein the trench has an aspect ratio of 2 to 3.

16. The method as in claim 1 wherein the metal layer is formed higher than the gap and planarized.

17. The method as in claim 1 further comprising the step of masking a portion of the spacer, wherein only an exposed portion of the spacer is removed.

18. A method of forming a metal line on a substrate, comprising:

forming a step on the substrate;

forming a first layer on the substrate and on the step;

etching the first layer to leave a spacer next to the step;

forming a second layer over the substrate and the step;

planarizing the second layer to expose the spacer;

etching the spacer to leave a trench between the second layer and the step;

forming a metal layer over the substrate; and planarizing the metal layer.

19. A method of forming a metal line, comprising:

forming a step on the substrate;

forming a first layer on the substrate and on the step;

etching the first layer to leave a spacer around a periphery of the step;

forming a second layer over the substrate;

planarizing the second layer to expose the spacer;

forming a mask over a portion of the spacer;

etching an exposed portion of the spacer to leave a trench; and filling the trench with a metal layer.

20. A method of forming a metal line, comprising:

forming a step on a substrate;

forming a first layer on the substrate;

etching the first layer to leave a spacer around a periphery of the step;

forming a mask over a portion of the spacer;

etching an exposed portion of the spacer;

forming a second layer over the substrate;

planarizing the second layer to expose the spacer;

etching the spacer to leave a trench; and filling the trench with a metal layer.

* * * * *